(12) United States Patent
Takekida

(10) Patent No.: US 11,895,839 B2
(45) Date of Patent: Feb. 6, 2024

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventor: Hideto Takekida, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 168 days.

(21) Appl. No.: 17/675,826

(22) Filed: Feb. 18, 2022

(65) Prior Publication Data

US 2023/0062309 A1 Mar. 2, 2023

(30) Foreign Application Priority Data

Aug. 27, 2021 (JP) ................. 2021-139106

(51) Int. Cl.
*H10B 43/27* (2023.01)
*G11C 16/34* (2006.01)
*G11C 16/26* (2006.01)
*G11C 16/10* (2006.01)
*H10B 41/27* (2023.01)
*G11C 16/04* (2006.01)
*H10B 41/35* (2023.01)
*H10B 43/35* (2023.01)

(52) U.S. Cl.
CPC ......... *H10B 43/27* (2023.02); *G11C 16/0466* (2013.01); *G11C 16/0483* (2013.01); *G11C 16/10* (2013.01); *G11C 16/26* (2013.01); *G11C 16/3459* (2013.01); *H10B 41/27* (2023.02); *H10B 41/35* (2023.02); *H10B 43/35* (2023.02); *G11C 2211/561* (2013.01)

(58) Field of Classification Search
CPC .... H10B 43/27; H10B 41/27; G11C 16/0466; G11C 16/0483; G11C 16/10; G11C 16/26; G11C 16/3459; G11C 2211/561; G11C 11/5628; G11C 2211/5621; G11C 16/08
See application file for complete search history.

(56) References Cited

U.S. PATENT DOCUMENTS

| 2005/0023597 A1 | 2/2005 | Kutsukake et al. |
| 2013/0146960 A1* | 6/2013 | Sakui ............... H10B 43/35 257/314 |
| 2017/0194340 A1 | 7/2017 | Lue |

(Continued)

FOREIGN PATENT DOCUMENTS

| JP | 2005-039216 A | 2/2005 |
| TW | 202111931 A | 3/2021 |

*Primary Examiner* — Donald H B Braswell
(74) *Attorney, Agent, or Firm* — Foley & Lardner LLP

(57) ABSTRACT

A semiconductor storage device includes a stack, a channel layer, a first charge storage portion, and a second charge storage portion. The stack includes a plurality of conductive layers and a plurality of insulating layers, and the plurality of conductive layers and the plurality of insulating layers are alternately stacked one by one in a first direction. The channel layer extends in the first direction in the stack. The first charge storage portion is provided between the channel layer and each of the plurality of conductive layers in a second direction intersecting with the first direction. The second charge storage portion includes a portion interposed between two adjacent conductive layers in the plurality of conductive layers in the first direction.

18 Claims, 15 Drawing Sheets

(56) References Cited

U.S. PATENT DOCUMENTS

| | | | |
|---|---|---|---|
| 2019/0172839 A1* | 6/2019 | Tokuda | H01L 29/7926 |
| 2021/0066346 A1* | 3/2021 | Lim | H10B 41/27 |
| 2021/0074592 A1 | 3/2021 | Shioda et al. | |
| 2021/0183883 A1* | 6/2021 | Zhang | H01L 29/40117 |
| 2022/0399362 A1* | 12/2022 | Mizutani | H10B 43/40 |

* cited by examiner

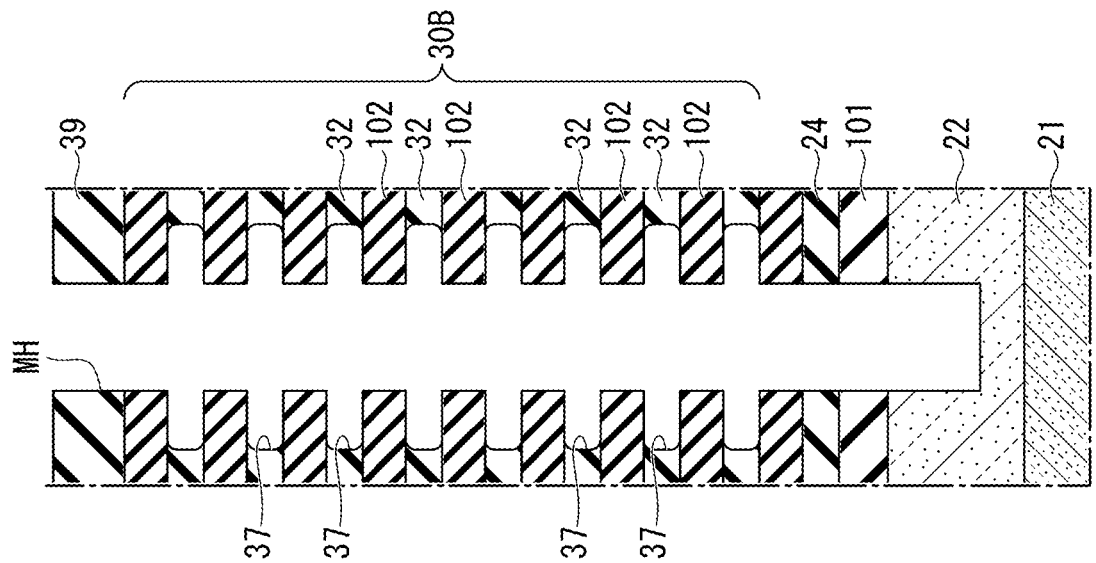
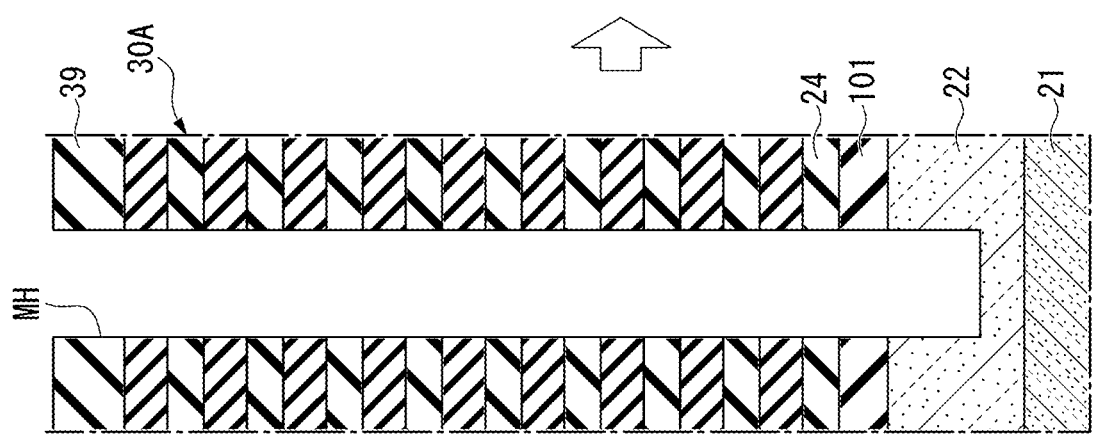
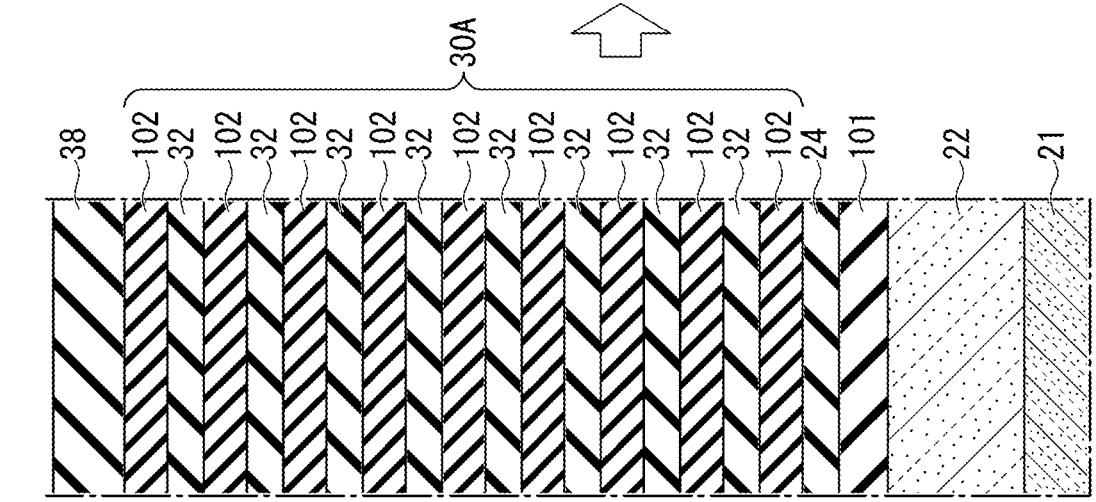

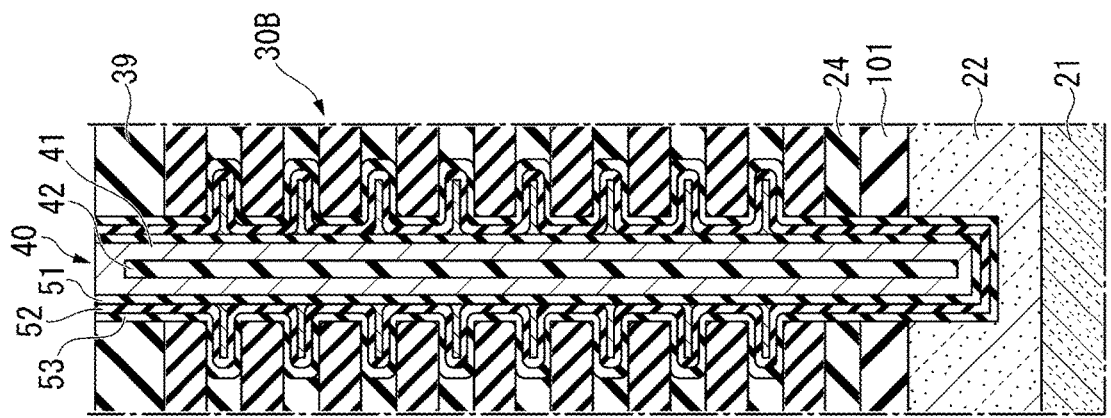
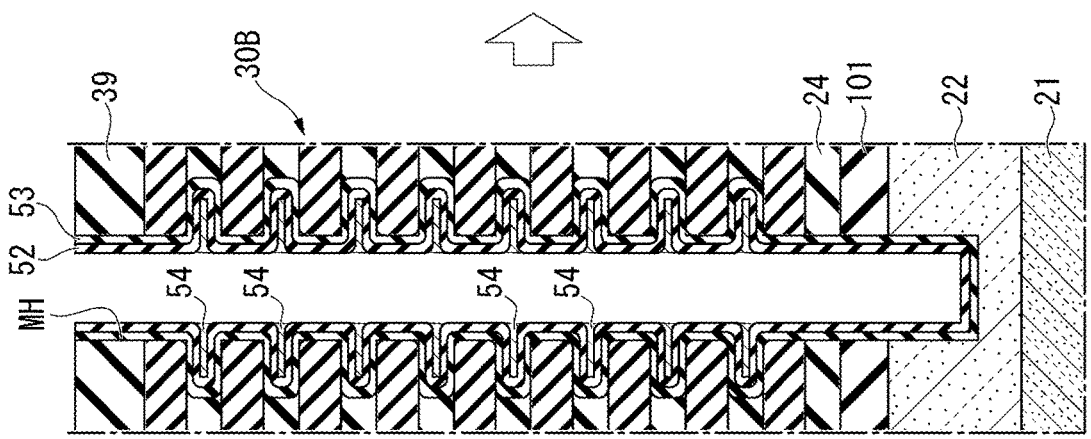
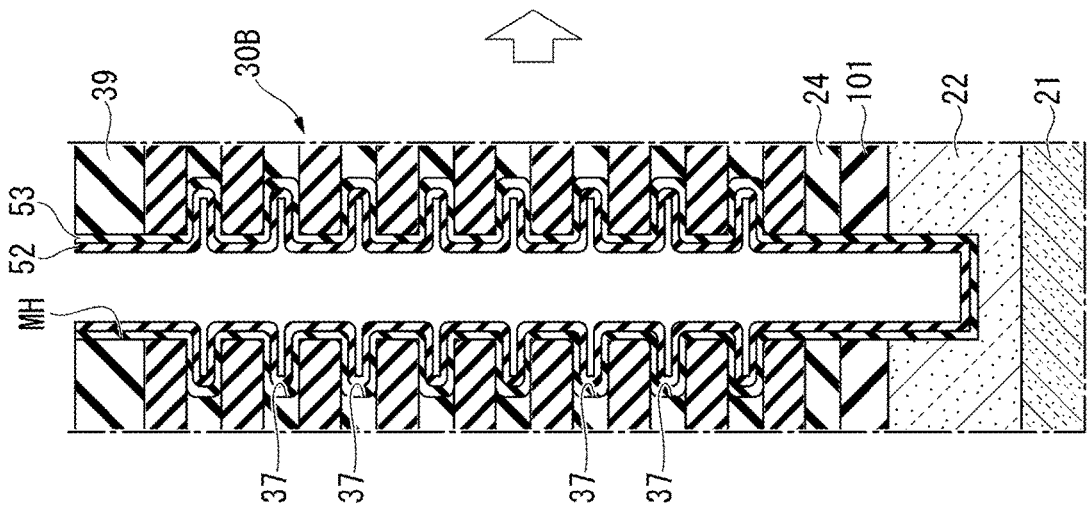

SEMICONDUCTOR STORAGE DEVICE AND METHOD OF MANUFACTURING SEMICONDUCTOR STORAGE DEVICE

CROSS-REFERENCE TO RELATED APPLICATION(S)

This application is based upon and claims the benefit of priority from Japanese Patent Application No. 2021-139106, filed Aug. 27, 2021, the entire contents of which are incorporated herein by reference.

FIELD

Embodiments described herein relate generally to a semiconductor storage device and a method of manufacturing the semiconductor storage device.

BACKGROUND

A NAND-type flash memory in which memory cells are three-dimensionally stacked is known.

DESCRIPTION OF THE DRAWINGS

FIGS. 13A to 13C are cross-sectional views illustrating a method of manufacturing the semiconductor storage device according to at least one embodiment.

FIGS. 14A to 14C are cross-sectional views illustrating a method of manufacturing the semiconductor storage device according to at least one embodiment.

DETAILED DESCRIPTION

Figure 1:
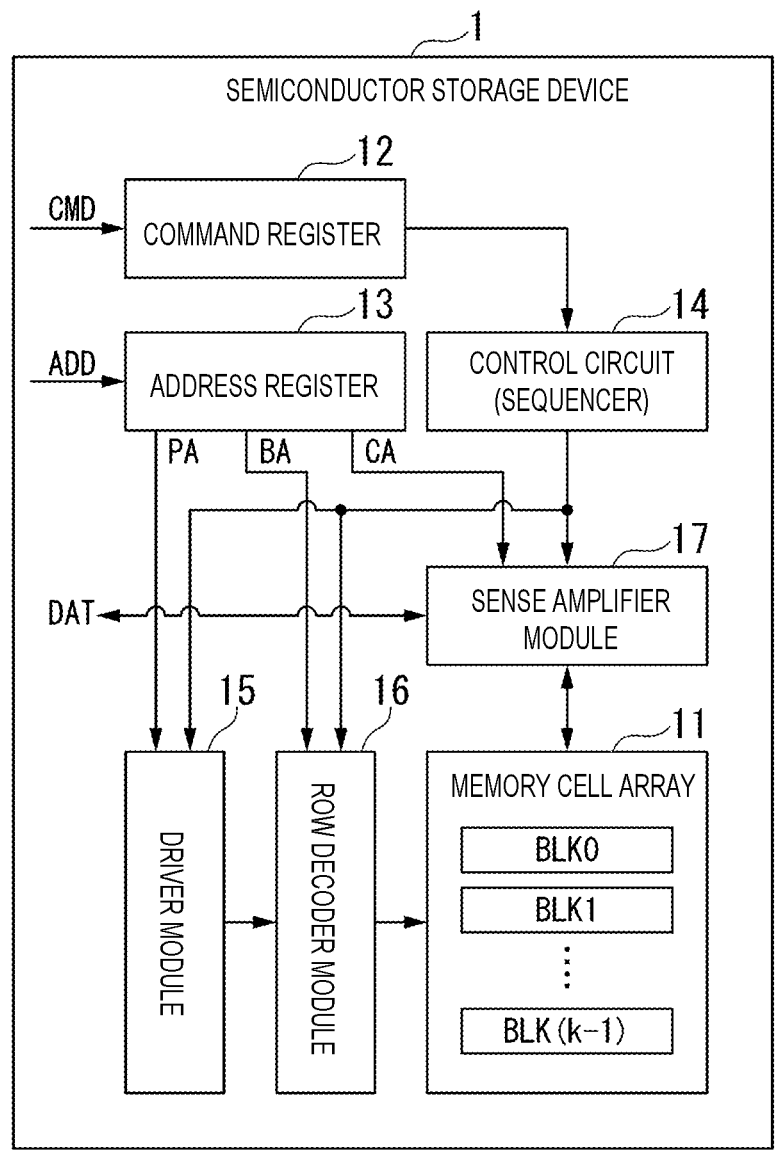
FIG. 1 is a block diagram illustrating a part of the configuration of a semiconductor storage device according to at least one embodiment.

Embodiments provide a semiconductor storage device suitable for increasing the capacity and a method of manufacturing the semiconductor storage device.

In general, according to at least one embodiment, a semiconductor storage device includes a stack, a channel layer, a first charge storage portion, and a second charge storage portion. The stack includes a plurality of conductive layers and a plurality of insulating layers, and the plurality of conductive layers and the plurality of insulating layers are alternately stacked one by one in a first direction. The channel layer extends in the first direction in the stack. The first charge storage portion is provided between the channel layer and each of the plurality of conductive layers in a second direction intersecting with the first direction. The second charge storage portion includes a portion interposed between two adjacent conductive layers in the plurality of conductive layers in the first direction.

Hereinafter, a semiconductor storage device and a method of manufacturing the semiconductor storage device according to at least one embodiment will be described with reference to the accompanying drawings. In the following description, the same reference numerals will be given to components having the same or similar functions. Then, duplicated descriptions of these components may be omitted. The phrases "parallel", "orthogonal", and "the same" may include a case of "substantially parallel", "substantially orthogonal", and "substantially the same", respectively. The term "connection" is not limited to a case of being physically connected, and may include a case of being electrically connected. That is, the term "connection" is not limited to the case where a plurality of elements is directly connected with each other, and may include the case where the plurality of elements are connected with another element interposed therebetween. The phrase "annular shape" is not limited to an annular shape, and may include a rectangular or triangular annular shape. The term "adjacent" is not limited to the case where a plurality of elements is in contact with each other, and may include the case where the plurality of elements are separated from each other (e.g., another element is interposed between the plurality of elements).

First, the X direction, Y direction, Z direction, and R direction will be defined. The X direction and the Y direction are directions along the surface of a silicon substrate 21 (see, e.g., FIG. 3), which will be described later. The X direction is a direction in which a word line WL (see, e.g., FIG. 3), which will be described later, extends. The Y direction is a direction intersecting with (e.g., orthogonal to) the X direction. The Y direction is a direction in which a bit line BL (see, e.g., FIG. 3), which will be described later, extends. The Z direction is a direction intersecting with (e.g., orthogonal to) the X direction and the Y direction. The Z direction is the thickness direction of the silicon substrate 21. In the following description, the direction from the silicon substrate 21 toward a stack 30 (to be described later) in the Z direction may be referred to as "upward", and the opposite direction may be referred to as "downward". However, these expressions are for convenience only and do not specify the direction of gravity. The R direction is the radial direction of a columnar body 40 (see, e.g., FIG. 3), which will be described later. The R direction is the direction on a plane along the X direction and the Y direction, and is the direction intersecting with (e.g., orthogonal to) the Z direction. The Z direction is an example of a "first direction". The R direction is an example of a "second direction".

Embodiment

<1. Configuration of Semiconductor Storage Device>

First, descriptions will be made on the configuration of a semiconductor storage device 1 according to at least one embodiment. In the drawings described below, the illustration of an insulating portion not related to the descriptions may be omitted. Further, in certain drawings, hatching indicating a cross section may be partially omitted in order to make the drawings easier to see.

FIG. 1 is a block diagram illustrating a part of the configuration of the semiconductor storage device 1. The semiconductor storage device 1 is, for example, a non-volatile semiconductor storage device and is a NAND-type flash memory. The semiconductor storage device 1 may be connected to, for example, an external device (hereinafter, referred to as a "host device") and is used as a storage space for the host device. The semiconductor storage device 1 includes, for example, a memory cell array 11, a command register 12, an address register 13, a control circuit (sequencer) 14, a driver module 15, a row decoder module 16, and a sense amplifier module 17.

The memory cell array 11 includes a plurality of blocks BLK0 to BLK (k−1) (k is an integer of 1 or more). The block BLK is a set of a plurality of memory cells that stores data in a non-volatile manner. The block BLK is used as a data erase unit. The memory cell array 11 is provided with a plurality of bit lines and a plurality of word lines. Each memory cell is associated with one bit line and one or two word lines.

The command register 12 stores a command CMD received by the semiconductor storage device 1 from the host device. The command CMD includes an instruction for causing the control circuit 14 to execute, for example, a write operation, a read operation, or an erase operation on the memory cell array 11.

The address register 13 stores address information ADD received by the semiconductor storage device 1 from the host device. The address information ADD includes, for example, a block address BA, a page address PA, and a column address CA. The block address BA, page address PA, and column address CA are used to select the block BLK, word line, and bit line, respectively.

The control circuit 14 is a circuit that controls the operation of the semiconductor storage device 1. For example, the control circuit 14 controls a driver module 15, a row decoder module 16, and a sense amplifier module 17 based on the command CMD stored in the command register 12, and executes a write operation, a read operation, and an erase operation on the memory cell array 11. The control circuit 14 is an example of a "circuit".

The driver module 15 includes a voltage generation circuit and generates a voltage used in a write operation, a read operation, or an erase operation. The driver module 15 applies the generated voltage to the signal line corresponding to the selected word line based on, for example, the page address PA stored in the address register 13.

The row decoder module 16 selects one block BLK in the corresponding memory cell array 11 based on the block address BA stored in the address register 13. The row decoder module 16 transfers, for example, the voltage applied to the signal line corresponding to the selected word line to the selected word line in the selected block BLK.

In the write operation, the sense amplifier module 17 applies a desired voltage to each bit line according to the write data DAT received by the semiconductor storage device 1 from the host device. In the read operation, the sense amplifier module 17 determines the data value stored in each memory cell based on the voltage of the bit line, and transfers the determination result as the read data DAT to the host device.

<2. Configuration of Memory Cell Array>
<2.1 Planar Structure of Memory Cell Array>

Next, the configuration of the memory cell array 11 will be described.

Figure 2:
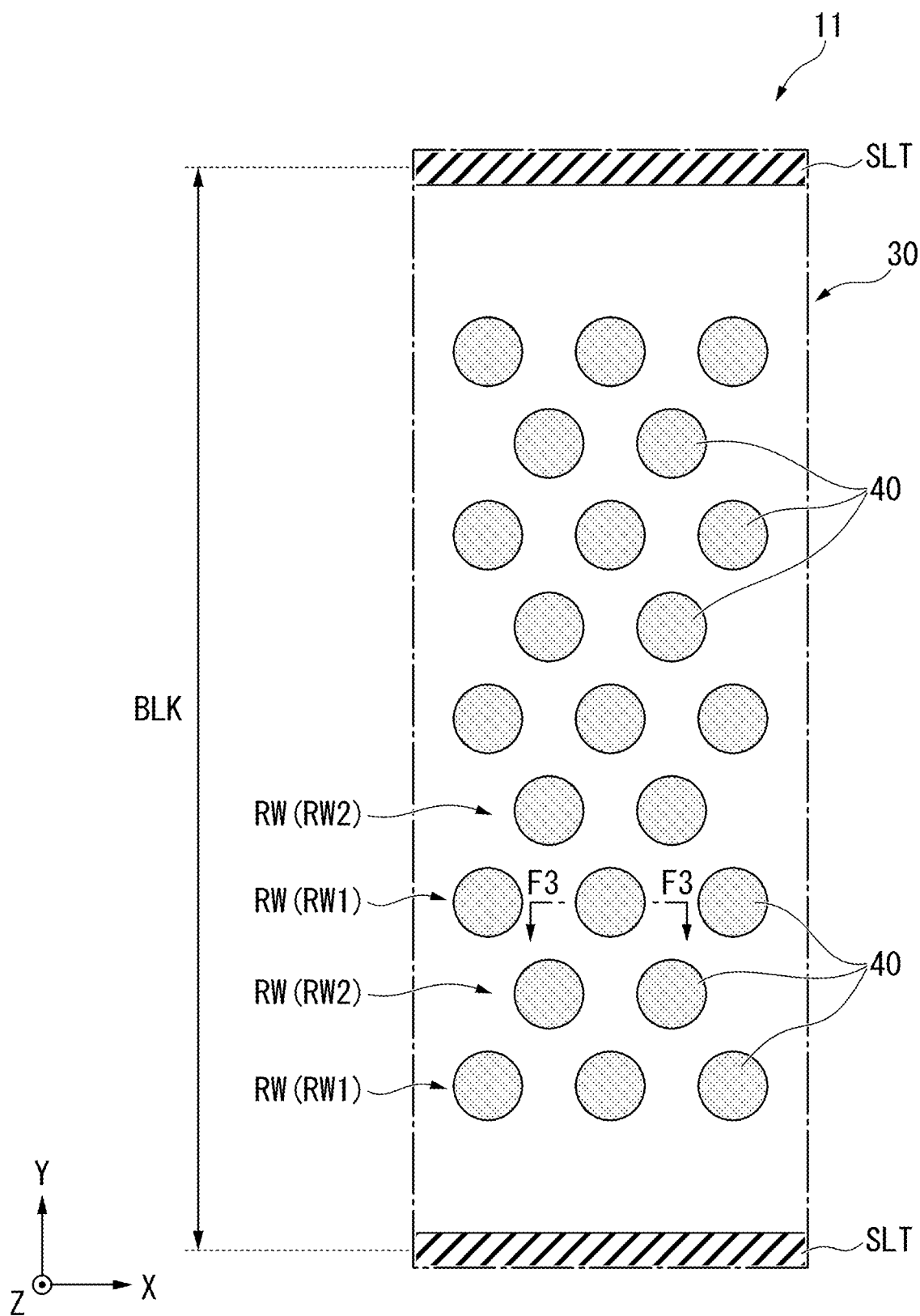
FIG. 2 is a cross-sectional view illustrating a part of a memory cell array according to at least one embodiment.

FIG. 2 is a cross-sectional view illustrating a part of the memory cell array 11. The memory cell array 11 includes, for example, a stack 30, a plurality of columnar bodies 40, and a plurality of insulators SLT.

The stack 30 includes a plurality of conductive layers 31 and a plurality of insulating layers 32 as described later (see, e.g., FIG. 3). The plurality of conductive layers 31 and the plurality of insulating layers 32 are alternately stacked one by one in the Z direction.

The plurality of columnar bodies 40 are arranged at intervals from each other on the surfaces along the X direction and the Y direction. The plurality of columnar bodies 40 are provided, for example, at different positions in the Y direction and are divided into a plurality of rows RWs extending in the X direction. The plurality of columnar bodies 40 disposed in the even-numbered rows RW2 from the end in the Y direction among the plurality of rows RWs are arranged offset in the X direction with respect to the plurality of columnar bodies 40 disposed in the odd-numbered rows RW1 from the end in the Y direction among the plurality of rows RWs. Each of the plurality of columnar bodies 40 extends in the Z direction in the stack 30.

The plurality of insulators SLTs are arranged apart from each other in the Y direction, and each extends in the X direction. Each of the plurality of insulators SLTs extends in the Z direction in the stack 30 and penetrates the stack 30. As a result, the stack 30 is divided into a plurality of blocks BLK.

<2.2 Cross-Sectional Structure of Memory Cell Array>

Figure 3:
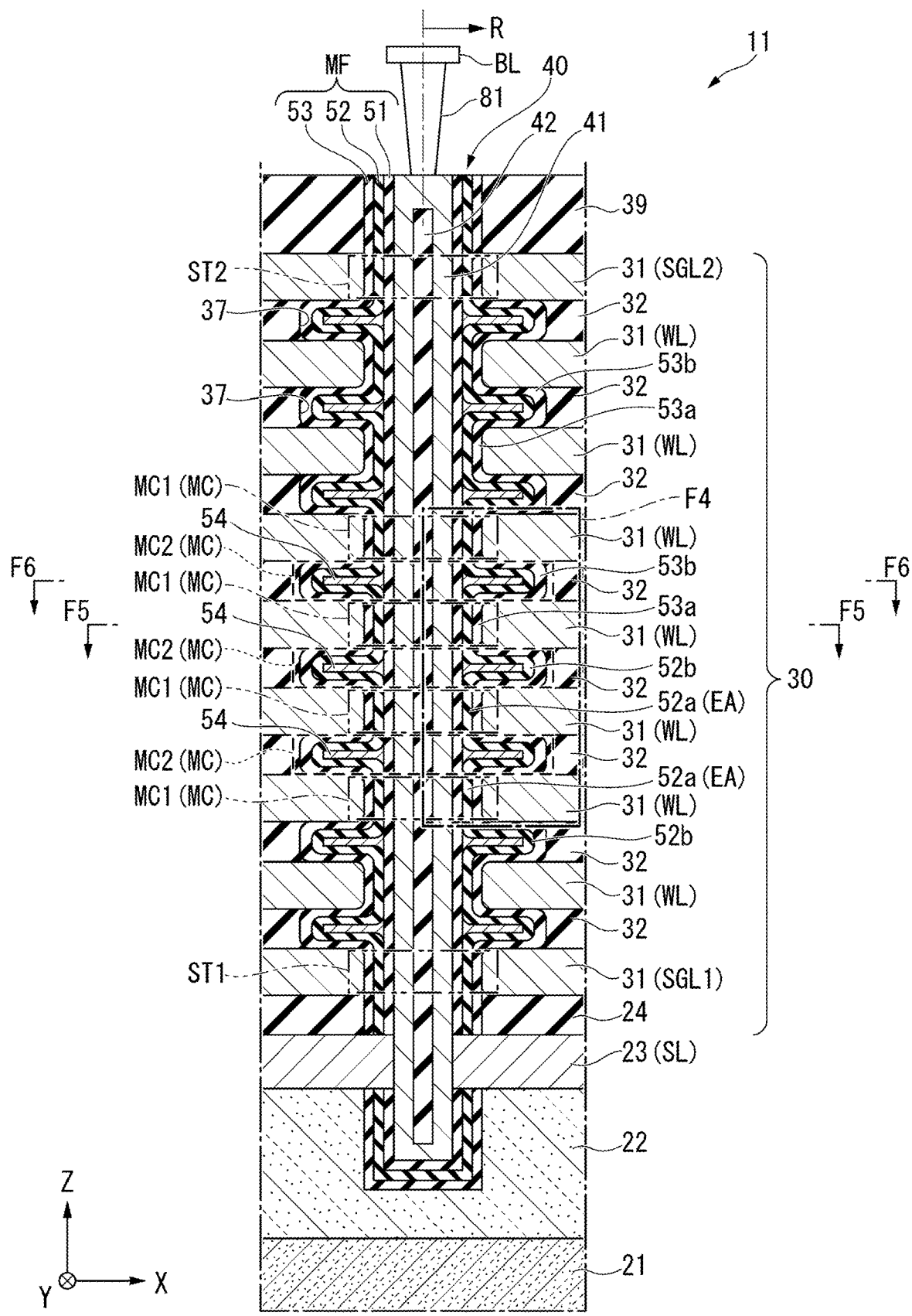
FIG. 3 is a cross-sectional view taken along line F3-F3 of a part of the memory cell array illustrated in FIG. 2.

FIG. 3 is a cross-sectional view taken along line F3-F3 of a part of the memory cell array 11 illustrated in FIG. 2. The semiconductor storage device 1 includes, for example, a silicon substrate 21, a semiconductor layer 22, a conductive layer 23, an insulating layer 24, a stack 30, an insulating layer 39, a plurality of columnar bodies (memory pillars) 40, a plurality of contacts 81, and a plurality of bit lines BL. Further, in FIG. 3, the columnar body 40, the contact 81, and the bit line BL are illustrated one by one.

<2.2.1 Substructure>

The silicon substrate 21 is a substrate on which the semiconductor storage device 1 is based. At least a part of the silicon substrate 21 is formed in a plate shape along the X direction and the Y direction. The silicon substrate 21 is formed of, for example, a semiconductor material containing silicon. The silicon substrate 21 is an example of a "substrate".

The semiconductor layer 22 is provided on the silicon substrate 21. The semiconductor layer 22 is layered along the X and Y directions. The semiconductor layer 22 is a stopper layer that prevents deep digging of a memory hole MH (see, e.g., FIG. 12) in the manufacturing process of the semiconductor storage device 1. The semiconductor layer 22 is formed of a semiconductor material such as polysilicon.

The semiconductor storage device 1 may have an insulating layer as a stopper layer instead of the semiconductor layer 22.

The conductive layer 23 is provided on the semiconductor layer 22. The conductive layer 23 is layered along the X and Y directions. The conductive layer 23 is formed of a conductive material such as tungsten. The lower end of the columnar body 40 is connected to the conductive layer 23. The conductive layer 23 functions as a source line SL for the columnar body 40.

The insulating layer 24 is provided on the conductive layer 23. The insulating layer 24 is layered along the X and Y directions. The insulating layer 24 is formed of an insulating material such as a silicon oxide.

<2.2.2 Stack>

Next, the stack 30 will be described. The stack 30 is provided on the insulating layer 24. The stack 30 includes, for example, a plurality of conductive layers 31 and a plurality of insulating layers 32. The plurality of conductive layers 31 and the plurality of insulating layers 32 are alternately stacked one by one in the Z direction. In FIG. 3, only nine conductive layers 31 are illustrated, but in actuality, more conductive layers 31 and insulating layers 32 are stacked.

The conductive layer 31 is formed in a plate shape along the X direction and the Y direction. The conductive layer 31 extends in the X direction. Of the plurality of conductive layers 31, one (or a plurality) of the conductive layers 31 closest to the silicon substrate 21 functions as a first select gate line SGL1. The intersection of the first select gate line SGL1 and the columnar body 40 functions as a first select transistor ST1. When a predetermined voltage is applied to the first select gate line SGL1, the first select transistor ST1 is turned on to electrically connect the columnar body 40 and the source line SL. The first select gate line SGL1 is commonly provided for a plurality of columnar bodies 40. Although FIG. 3 illustrates the case where one conductive layer 31 exists as the first select gate line SGL1, two or more conductive layers 31 may exist as the first select gate line SGL1. That is, a plurality of first select gate lines SGL1 may be provided between the silicon substrate 21 and the plurality of word lines WL in the Z direction.

Of the plurality of conductive layers 31, one (or a plurality) of the conductive layers 31 farthest from the silicon substrate 21 functions as a second select gate line SGL2. The intersection of the second select gate line SGL2 and the columnar body 40 functions as a second select transistor ST2. When a predetermined voltage is applied to the second select gate line SGL2, the second select transistor ST2 is turned on to electrically connect the columnar body 40 and the bit line BL. The second select gate line SGL2 is commonly provided for the plurality of columnar bodies 40. Although FIG. 3 illustrates the case where one conductive layer 31 exists as the second select gate line SGL2, two or more conductive layers 31 may exist as the second select gate line SGL2. That is, a plurality of second select gate lines SGL2 may be provided on the side opposite to the silicon substrate 21 with respect to the plurality of word line WLs in the Z direction.

Of the plurality of conductive layers 31, the remaining conductive layer 31 sandwiched between the conductive layers 31 that function as the first select gate line SGL1 or the second select gate line SGL2 functions as the word line WL. In at least one embodiment, the intersection of the word line WL and the columnar body 40 functions as a first memory cell (first memory cell transistor) MC1. Further, in at least one embodiment, a plurality of second memory cells (second memory cell transistors) MC2 are provided each interposed between two word lines WLs adjacent to each other in the Z direction and include a portion interposed between the two word lines WLs. The first memory cell MC1 and the second memory cell MC2 will be described in detail later. In the following, when the first memory cell MC1 and the second memory cell MC2 are not distinguished from each other, they may be simply referred to as a "memory cell MC". A voltage is applied to the word line WL when writing a data value to the memory cell MC, reading a data value from the memory cell MC, or erasing the data value written in the memory cell MC. Each word line WL is commonly provided for a plurality of memory cells MC arranged in the X direction and the Y direction.

Further, one or more first dummy lines (first dummy word line) may be provided between the plurality of word lines WL and the first select gate line SGL1 in the Z direction. The first dummy line is a conductive layer 31 that is not connected to a transistor functioning as the first memory cell MC1. The first dummy line functions as a buffer between the first select gate line SGL1 and the plurality of word lines WL so that the voltage applied to the first select gate line SGL1 is not easily transmitted to the word line WL.

Similarly, one or more second dummy lines (second dummy word line) may be provided between the plurality of word lines WL and the second select gate line SGL2 in the Z direction. The second dummy line is a conductive layer 31 that is not connected to a transistor functioning as the first memory cell MC1. The second dummy line functions as a buffer between the second select gate line SGL2 and the plurality of word lines WL so that the voltage applied to the second select gate line SGL2 is not easily transmitted to the word line WL.

Figure 4:
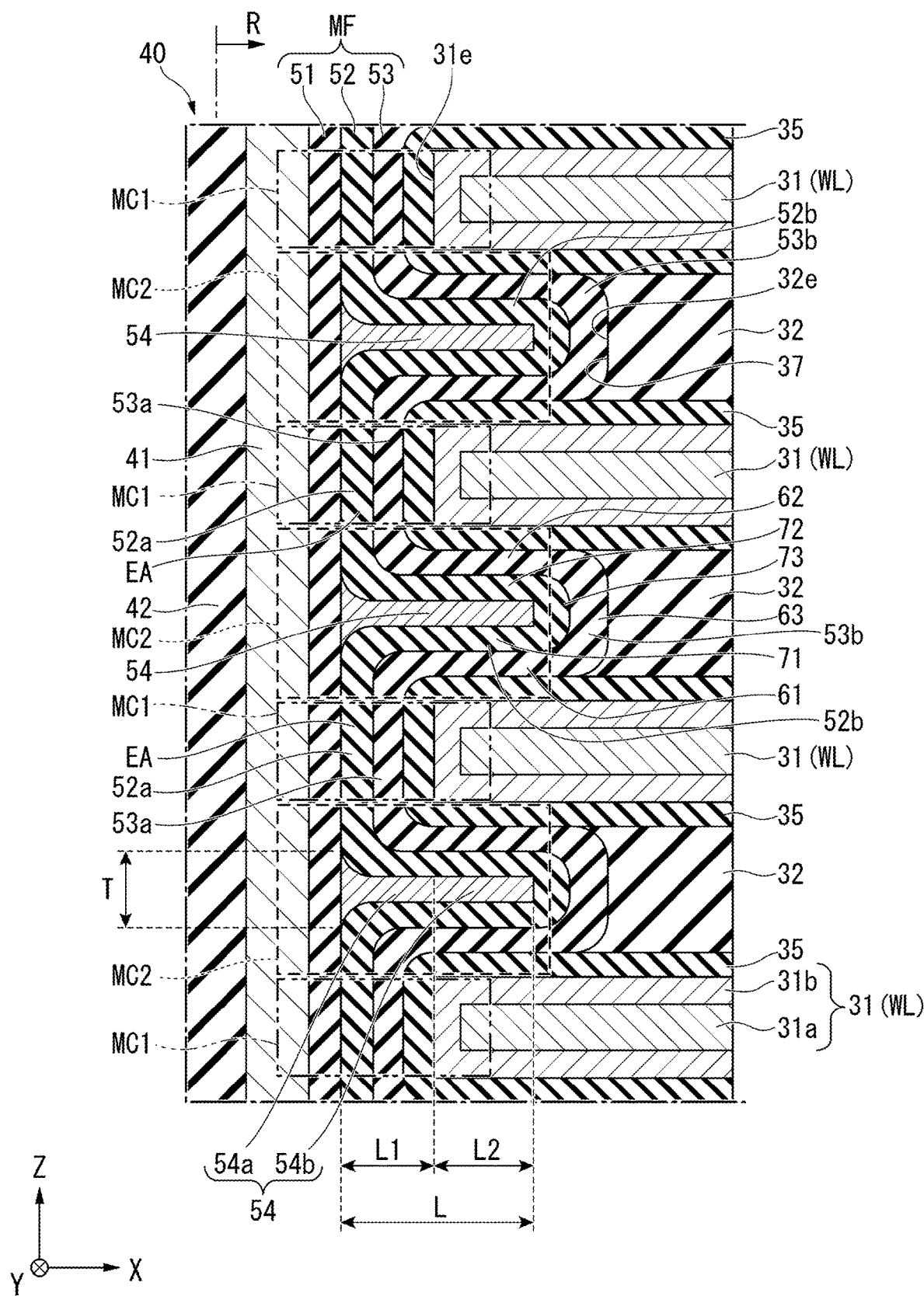
FIG. 4 is an enlarged cross-sectional view illustrating a region surrounded by line F4 illustrated in FIG. 3.

Each conductive layer 31 includes, for example, a main body portion 31a and a barrier film 31b (see, e.g., FIG. 4). The main body portion 31a is made of a conductive material such as tungsten. The barrier film 31b is provided on the surface of the main body portion 31a. The barrier film 31b is, for example, a titanium nitride film or a stacked structure film of titanium nitride and titanium. An insulating film 35 is provided on the surface of the barrier film 31b. The insulating film 35 is a metal oxide such as an aluminum oxide. The insulating film 35 functions as a block insulating film for a charge storage portion EA (to be described later) and a floating gate electrode 54 (to be described later), together with the block insulating film 53 (to be described later).

The insulating layer 32 is an interlayer insulating film that is provided between two conductive layers 31 adjacent to each other in the Z direction and insulates the two conductive layers 31. The insulating layer 32 is formed in a plate shape along the X direction and the Y direction. The insulating layer 32 is formed of an insulating material such as a silicon oxide. In the present embodiment, the insulating layer 32 is separated from the channel layer 41 of the columnar body 40 as compared with the conductive layer 31. For example, the insulating layer 32 has a cross section 32e (see, e.g., FIG. 4) facing the center of the columnar body 40 in the R direction. The conductive layer 31 has a cross section 31e (see, e.g., FIG. 4) facing the center of the columnar body 40 in the R direction. The cross section 32e of the insulating layer 32 is separated from the channel layer 41 of the columnar body 40 as compared with the cross section 31e of the conductive layer 31. As a result, the inner surface of the stack 30 facing the columnar body 40 has a plurality of recesses 37 in which the portions corresponding to the plurality of insulating layers 32 are recessed in the R direction.

The insulating layer 39 is provided on the stack 30. The insulating layer 39 is formed in a plate shape along the X direction and the Y direction. The insulating layer 39 is formed of an insulating material such as a silicon oxide.

<2.2.3 Columnar Body>

Next, the columnar body 40 will be described. In at least one present embodiment, the columnar body 40 has a columnar or inverted cone shape. The columnar body 40 extends in the Z direction and penetrates the insulating layer 39, the stack 30, the insulating layer 24, and the conductive layer 23. The lower end of the columnar body 40 penetrates into the semiconductor layer 22. The columnar body 40 includes, for example, a channel layer 41, a core insulating portion 42, and a multilayer film MF.

The channel layer 41 is provided inside the multilayer film MF. The channel layer 41 is formed in an annular shape and extends in the Z direction over the entire length (total height) of the columnar body 40. Here, the portion of the multilayer film MF located at the same height as the source line SL is removed. As a result, the lower end of the channel layer 41 is in contact with the source line SL and is connected to the source line SL. The channel layer 41 is made of a semiconductor material such as polysilicon. The channel layer 41 may be doped with impurities. The impurity contained in the channel layer 41 is, for example, any one selected from the group consisting of carbon, phosphorus, boron, and germanium. The channel layer 41 forms a channel to electrically connect the bit line BL and the source line SL when a voltage is applied to the word line WL.

The core insulating portion 42 is provided inside the channel layer 41 and fills the inside of the channel layer 41. The core insulating portion 42 extends in the Z direction to cover most of the columnar body 40. The core insulating portion 42 is formed of an insulating material such as a silicon oxide.

The multilayer film MF is provided on the outer periphery of the channel layer 41. The multilayer film MF includes, for example, a tunnel insulating film 51, a charge trap film 52, a block insulating film 53, and a plurality of floating gate electrodes 54.

The tunnel insulating film 51 is provided on the outer periphery of the channel layer 41. The tunnel insulating film 51 is located between the channel layer 41 and the charge trap film 52. The tunnel insulating film 51 is formed in an annular shape along the outer peripheral surface of the channel layer 41 and extends in the Z direction along the channel layer 41. The tunnel insulating film 51 extends in the Z direction to cover most of the columnar body 40. The tunnel insulating film 51 is a potential barrier between the channel layer 41 and the charge trap film 52. The tunnel insulating film 51 includes a silicon oxide or a silicon oxide and a silicon nitride. The tunnel insulating film 51 may be referred to as an "insulating layer".

The charge trap film 52 is provided on the outer periphery of the tunnel insulating film 51. The charge trap film 52 is located between the tunnel insulating film 51 and the block insulating film 53. From another point of view, the charge trap film 52 is located between the channel layer 41 and the plurality of conductive layers 31. The charge trap film 52 extends in the Z direction to cover most of the columnar body 40. The charge trap film 52 has multiple crystal defects (capture levels) and is a functional film capable of capturing charges in the crystal defects. The charge trap film 52 is formed of, for example, a silicon nitride. A silicon nitride is an example of a "first material".

In at least one embodiment, the charge trap film 52 includes a plurality of first portions 52a and a plurality of second portions 52b. Each of the first portions 52a is located at the same height as the word line WL in the Z direction. That is, the first portion 52a is located between the channel layer 41 and the word line WL in the R direction. The first portion 52a extends in the Z direction along the channel layer 41. At least a part of the first portion 52a forms a charge storage portion EA capable of accumulating charges. The charge storage portion EA is a charge trap type charge storage portion. The charge storage portion EA is an example of the "first charge storage portion".

Meanwhile, each of the second portions 52b is located at the same height as the insulating layer 32 in the Z direction. That is, the second portion 52b is located between the channel layer 41 and the insulating layer 32 in the R direction. The second portion 52b bulges from the first portion 52a in a direction away from the channel layer 41. A part of the second portion 52b is located in the recess 37 of the stack 30 away from the channel layer 41 as compared with the first portion 52a. That is, a part of the second portion 52b is interposed between the two word lines WL in the Z direction. An example of the second portion 52b will be described in detail in the description of the floating gate electrode 54.

The block insulating film 53 is provided on the outer periphery of the charge trap film 52. The block insulating film 53 is located between the charge trap film 52 and the plurality of conductive layers 31. Further, the block insulating film 53 is located between the charge trap film 52 and the plurality of insulating layers 32. The block insulating film 53 is an insulating film that prevents back tunneling. Back tunneling is a phenomenon in which an electric charge returns from the word line WL to the charge trap film 52 or the floating gate electrode 54. The block insulating film 53 extends in the Z direction to cover most of the columnar body 40 in the Z direction. The block insulating film 53 is a stacked structural film in which a plurality of insulating films such as a silicon oxide film or a metal oxide film is stacked. An example of a metal oxide is an aluminum oxide. The block insulating film 53 may contain a high dielectric constant material (high-k material) such as a silicon nitride or a hafnium oxide. The block insulating film 53 may be referred to as an "insulating layer".

In at least one embodiment, the block insulating film 53 includes a plurality of first portions 53a and a plurality of second portions 52b. Each of the first portions 53a is located at the same height as the word line WL in the Z direction. That is, the first portion 53a is located between the channel layer 41 and the word line WL in the R direction. The first portion 53a extends in the Z direction along the channel layer 41.

Meanwhile, each of the second portions 53b is located at the same height as the insulating layer 32 in the Z direction. That is, the second portion 53b is located between the channel layer 41 and the insulating layer 32 in the R direction. The second portion 53b bulges from the first portion 53a in a direction away from the channel layer 41. A part of the second portion 53b is located in the recess 37 of the stack 30 away from the channel layer 41 as compared with the first portion 53a. That is, a part of the second portion 53b is interposed between the two word lines WL in the Z direction. An example of the second portion 53b will be described in detail in the description of the floating gate electrode 54.

The floating gate electrode 54 is located at the same height as the insulating layer 32 in the Z direction. That is, the floating gate electrode 54 is located between the channel layer 41 and the insulating layer 32 in the R direction. A part of the floating gate electrode 54 is located in the recess 37 of the stack 30. That is, a part of the floating gate electrode 54 is interposed between the two word lines WL in the Z direction.

The floating gate electrode 54 is an electrode capable of accumulating electric charges. The floating gate electrode 54 is formed of, for example, polysilicon containing impurities. Polysilicon containing impurities is an example of a "second material". The impurities contained in polysilicon are, for example, phosphorus or boron. The floating gate electrode 54 is a charge storage portion of a floating gate method (floating gate system). The floating gate electrode 54 is an example of a "second charge storage portion". As illustrated in FIG. 3, in the present embodiment, the first charge storage portion (charge storage portion EA) by the charge trap method and the second charge storage portion (floating gate electrode 54) by the floating gate method are alternately arranged in the Z direction.

FIG. 4 is an enlarged cross-sectional view illustrating a region surrounded by line F4 illustrated in FIG. 3. In the following, focusing on one floating gate electrode 54, among the two word lines WLs located above and below the floating gate electrode 54, the word line WL located below the floating gate electrode 54 is referred to as a "lower word line WL", and among the above two word lines WLs, the word line WL located above the floating gate electrode 54 is referred to as an "upper word line WL".

The second portion 53b of the block insulating film 53 includes a first film portion 61, a second film portion 62, and a third film portion 63. The first film portion 61 is located between the floating gate electrode 54 and the lower word line WL in the Z direction, and extends in the X and Y directions along the upper surface of the lower word line WL. The second film portion 62 is located between the floating gate electrode 54 and the upper word line WL in the Z direction, and extends in the X and Y directions along the lower surface of the upper word line WL. The third film portion 63 extends in the Z direction at the inner portion of the recess 37, and connects the outer peripheral end portion of the first film portion 61 and the outer peripheral end portion of the second film portion 62. As a result, the second portion 53b of the block insulating film 53 is formed in a bag shape capable of accommodating the floating gate electrode 54 and the second portion 52b of the charge trap film 52 inside.

The second portion 52b of the charge trap film 52 is provided inside the second portion 53b of the block insulating film 53. The second portion 52b of the charge trap film 52 includes a first film portion 71, a second film portion 72, and a third film portion 73. The first film portion 71 is located between the floating gate electrode 54 and the first film portion 61 of the block insulating film 53 in the Z direction, and extends in the X direction and the Y direction along the upper surface of the first film portion 61 of the block insulating film 53. The second film portion 72 is located between the floating gate electrode 54 and the second film portion 62 of the block insulating film 53 in the Z direction, and extends in the X and Y directions along the lower surface of the second film portion 62 of the block insulating film 53. The third film portion 73 extends in the Z direction along the inner surface of the third film portion 63 of the block insulating film 53 at the inner portion of the recess 37, and connects the outer peripheral end portion of the first film portion 71 and the outer peripheral end portion of the second film portion 72. As a result, the second portion 52b of the charge trap film 52 is formed in a bag shape capable of accommodating the floating gate electrode 54 inside.

The floating gate electrode 54 is located between the channel layer 41 and at least a part (e.g., the third film portion 73) of the second portion 52b of the charge trap film 52 in the R direction. In at least one embodiment, the floating gate electrode 54 is located between the tunnel insulating film 51 and at least a part (e.g., the third film portion 73) of the second portion 52b of the charge trap film 52 in the R direction.

In at least one embodiment, at least a part of the floating gate electrode 54 is located inside the second portion 52b of the bag-shaped charge trap film 52. For example, the floating gate electrode 54 is located between the first film portion 71 and the second film portion 72 of the charge trap film 52 in the Z direction. Further, the floating gate electrode 54 is located between the tunnel insulating film 51 and the third film portion 73 of the charge trap film 52 in the R direction. From another point of view, the floating gate electrode 54 is located between the first film portion 61 and the second film portion 62 of the block insulating film 53 in the Z direction. The floating gate electrode 54 is located between the tunnel insulating film 51 and the third film portion 63 of the block insulating film 53 in the R direction.

For example, a dimension L (e.g., the maximum dimension) of the floating gate electrode 54 in the R direction is larger than a dimension T (e.g., the maximum dimension) of the floating gate electrode 54 in the Z direction. In at least one embodiment, the floating gate electrode 54 includes a first portion 54a that does not overlap the word line WL in the Z direction and a second portion 54b that overlaps the word line WL in the Z direction. For example, a dimension L2 (e.g., the maximum dimension) of the second portion 54b in the R direction is larger than a dimension L1 (e.g., the maximum dimension) of the first portion 54a in the R direction.

In at least one embodiment, the dimension L of the floating gate electrode 54 is set to satisfy the following conditions. That is, a floating electrode voltage Vfg applied to the floating gate electrode 54 is determined by a power supply voltage Vcg applied to the word line WL and a coupling ratio Cr as represented in the equation (1).

$$Vfg = Vcg \times Cr \qquad (1)$$

Therefore, in order to efficiently write to the floating gate electrode 54, it is preferable that the coupling ratio Cr is high. For example, the coupling ratio Cr is preferably in the range of 0.5 to 0.6.

Here, the coupling ratio Cr is determined by a capacitance Cox between the floating gate electrode 54 and the channel layer 41, and a capacitance Cipd between the floating gate electrode 54 and the word line WL as represented in the equation (2).

$$Cr = Cipd/(Cox + Cipd) \qquad (2)$$

Therefore, the higher the capacitance Cipd is, the higher the coupling ratio Cr is.

Further, here, a capacitance C in the parallel flat plate is determined by a dielectric constant ε, a facing area S, and a film thickness d as in the equation (3).

$$C = \varepsilon \times S/d \qquad (3)$$

Therefore, the amount of penetration of the floating gate electrode 54 with respect to the two word lines WLs is determined so as to ensure the facing area S where the coupling ratio Cr falls in the range of 0.5 to 0.6. In the present embodiment, the facing area S is the sum of the facing area of the floating gate electrode 54 with respect to the lower word line WL and the facing area of the floating gate electrode 54 with respect to the upper word line WL.

<2.2.4 Superstructure>

Referring back to FIG. 3, the remaining configurations will be described.

Each of the plurality of contacts 81 is provided on the columnar body 40. The contact 81 extends in the Z direction and connects the bit line BL and the channel layer 41 of the columnar body 40. The contact 81 is made of a conductive material such as tungsten.

Each of the plurality of bit lines BL is provided on the contact 81. The bit line BL is connected to the channel layer 41 of the columnar body 40 via the contact 81. Thus, any memory cell MC may be selected from the plurality of memory cells MCs arranged three-dimensionally by a combination of the word line WL and the bit line BL.

<2.3 Structure of Memory Cell>

Next, the structures of the first memory cell MC1 and the second memory cell MC2 will be described.

Figure 5:
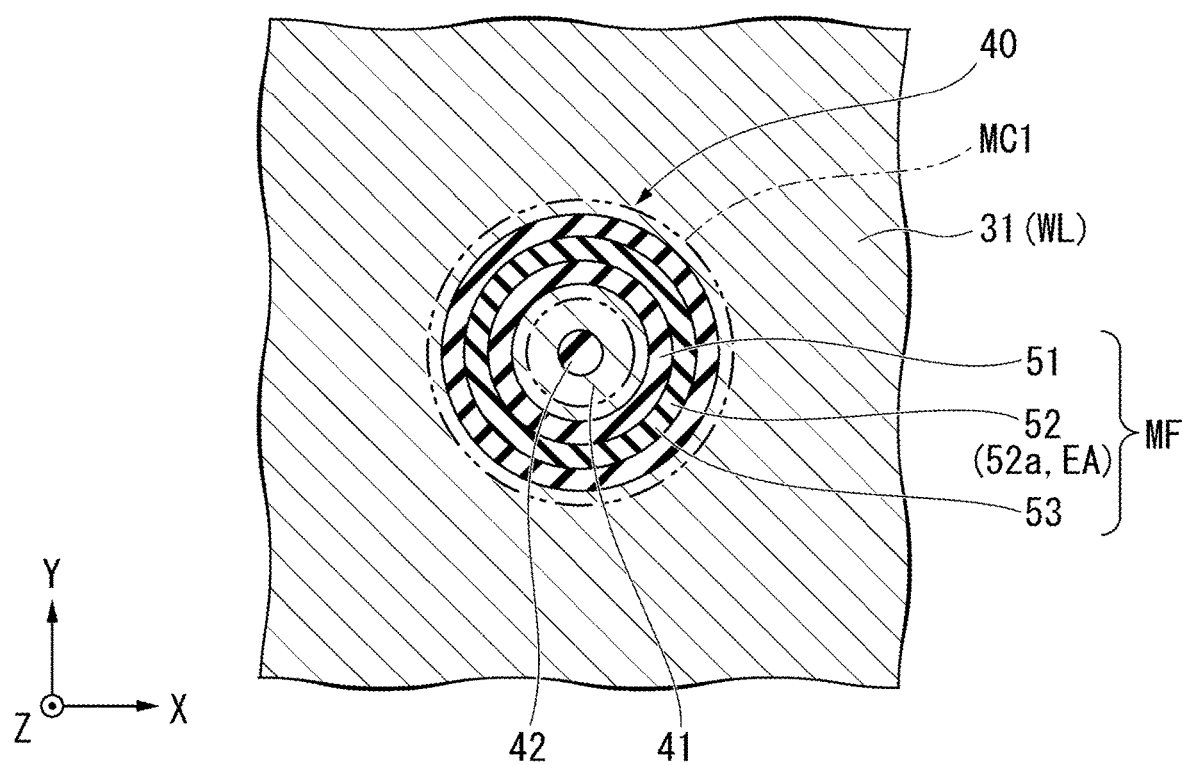
FIG. 5 is a cross-sectional view taken along line F5-F5 of a part of the memory cell array illustrated in FIG. 3.

FIG. 5 is a cross-sectional view taken along line F5-F5 of a part of the memory cell array 11 illustrated in FIG. 3. In the present embodiment, at the same height as each word line WL in the Z direction, a metal-Al-nitride-oxide-silicon (NANOS)-type first memory cell MC1 is formed by the end portion of the word line WL adjacent to the columnar body 40, the block insulating film 53, the charge storage portion EA formed by the charge trap film 52, the tunnel insulating film 51, and the channel layer 41. Hereinafter, for convenience of explanation, the first memory cell MC1 may be referred to as "MANOS".

Figure 6:
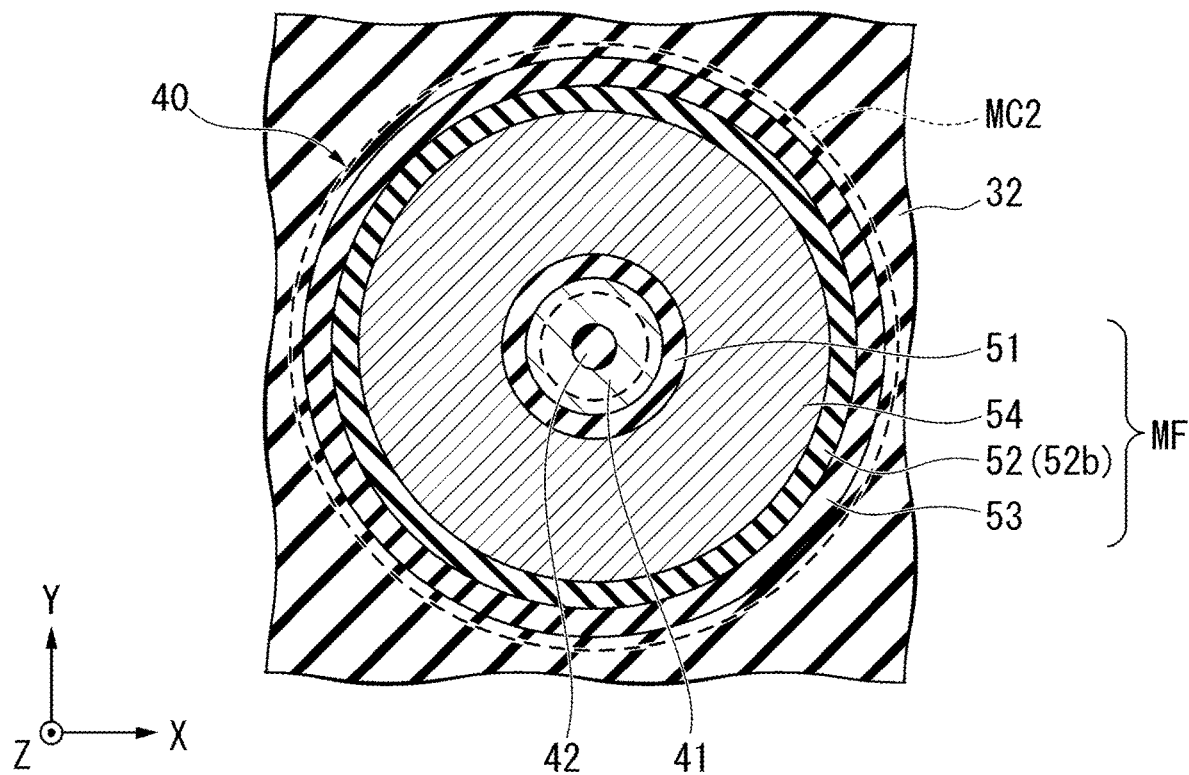
FIG. 6 is a cross-sectional view taken along line F6-F6 of a part of the memory cell array illustrated in FIG. 3.

FIG. 6 is a cross-sectional view taken along the line F6-F6 of a part of the memory cell array 11 illustrated in FIG. 3. In at least one embodiment, at the same height as the insulating layer 32 in the Z direction, a floating gate type second memory cell MC2 is formed by two word lines WLs located above and below the floating gate electrode 54, a block insulating film 53, a floating gate electrode 54, a tunnel insulating film 51, and a channel layer 41. A part of the charge storage function by the second memory cell MC2 may be implemented by the second portion 52b of the charge trap film 52. That is, the second portion 52b of the charge trap film 52 may function as an auxiliary charge storage portion. Hereinafter, for convenience of explanation, the second memory cell MC2 may be referred to as "FG".

<2.4 Operation of Memory Cell>

Next, the operations of the first memory cell MC1 and the second memory cell MC2 will be described.

Figure 7:
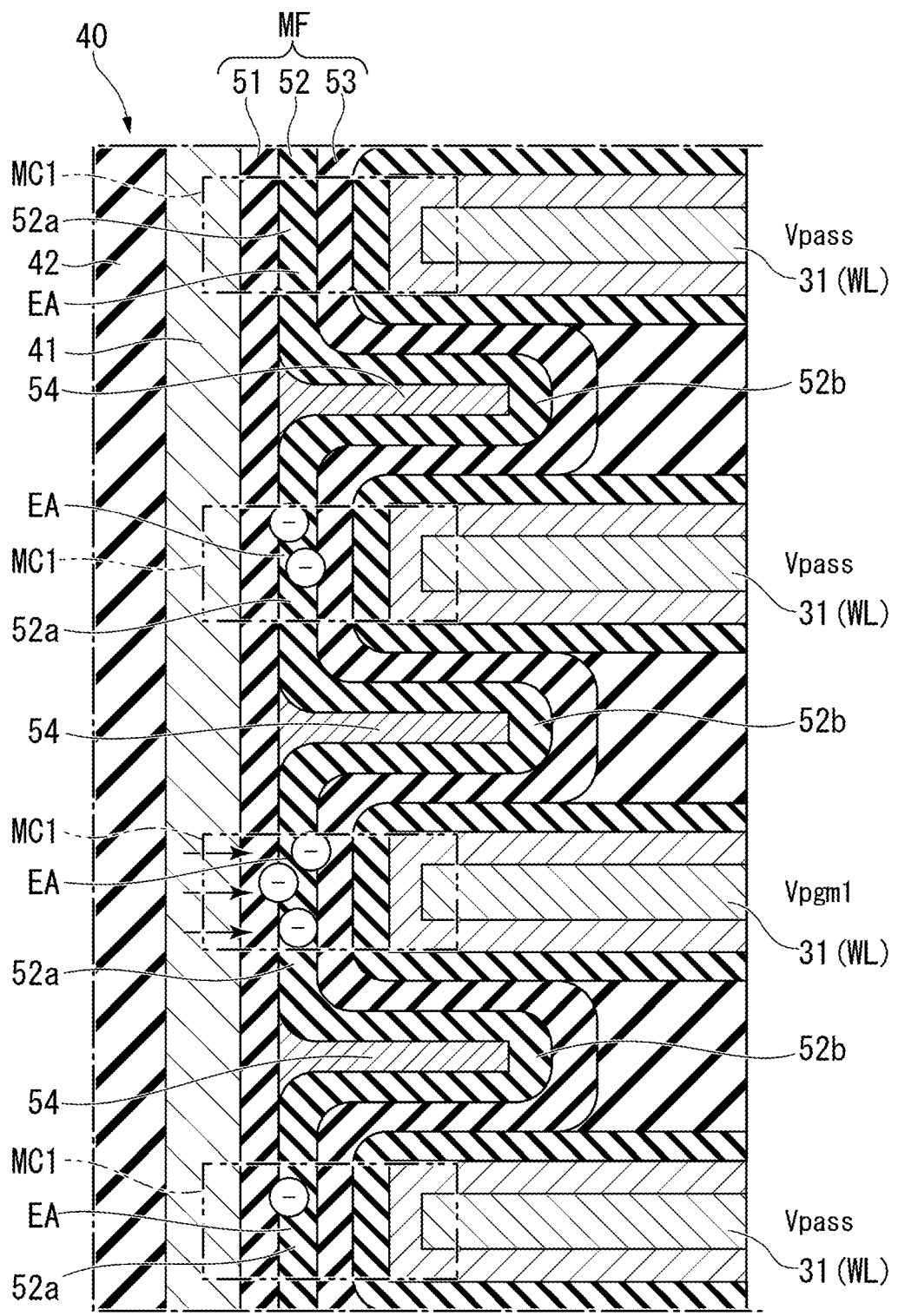
FIG. 7 is a cross-sectional view illustrating a write operation for a first memory cell according to at least one embodiment.

FIG. 7 is a cross-sectional view illustrating a write operation for the first memory cell MC1. In the write operation for the first memory cell MC1, a programming pulse as a first write voltage Vpgm1 is applied to the word line WL (hereinafter, referred to as a "selected word line WL") adjacent to the first memory cell MC1 to be written. A programming pulse is a pulse in which the voltage gradually increases with each cycle. Meanwhile, a voltage Vpass is applied to the word line WL other than the selected word line WL (hereinafter, referred to as a non-selected word line WL") because the voltage is so high that the memory cell MC adjacent to the non-selected word line WL is turned on and the voltage is so low that writing is not performed.

As a result, electrons are sucked up from the channel layer 41 in the charge storage portion EA of the first memory cell MC1 to be written, and charges are accumulated in the charge storage portion EA. The sense amplifier module 17 determines whether a threshold voltage of the first memory cell MC1 to be written reaches a voltage preset according to the data value to be written for each cycle of the programming pulse. Then, according to the determination result by the sense amplifier module 17, the application of the programming pulse is continued until the threshold voltage of the first memory cell MC1 reaches the voltage corresponding to the data value to be written. As a result, writing to the first memory cell MC1 is performed.

Figure 8:
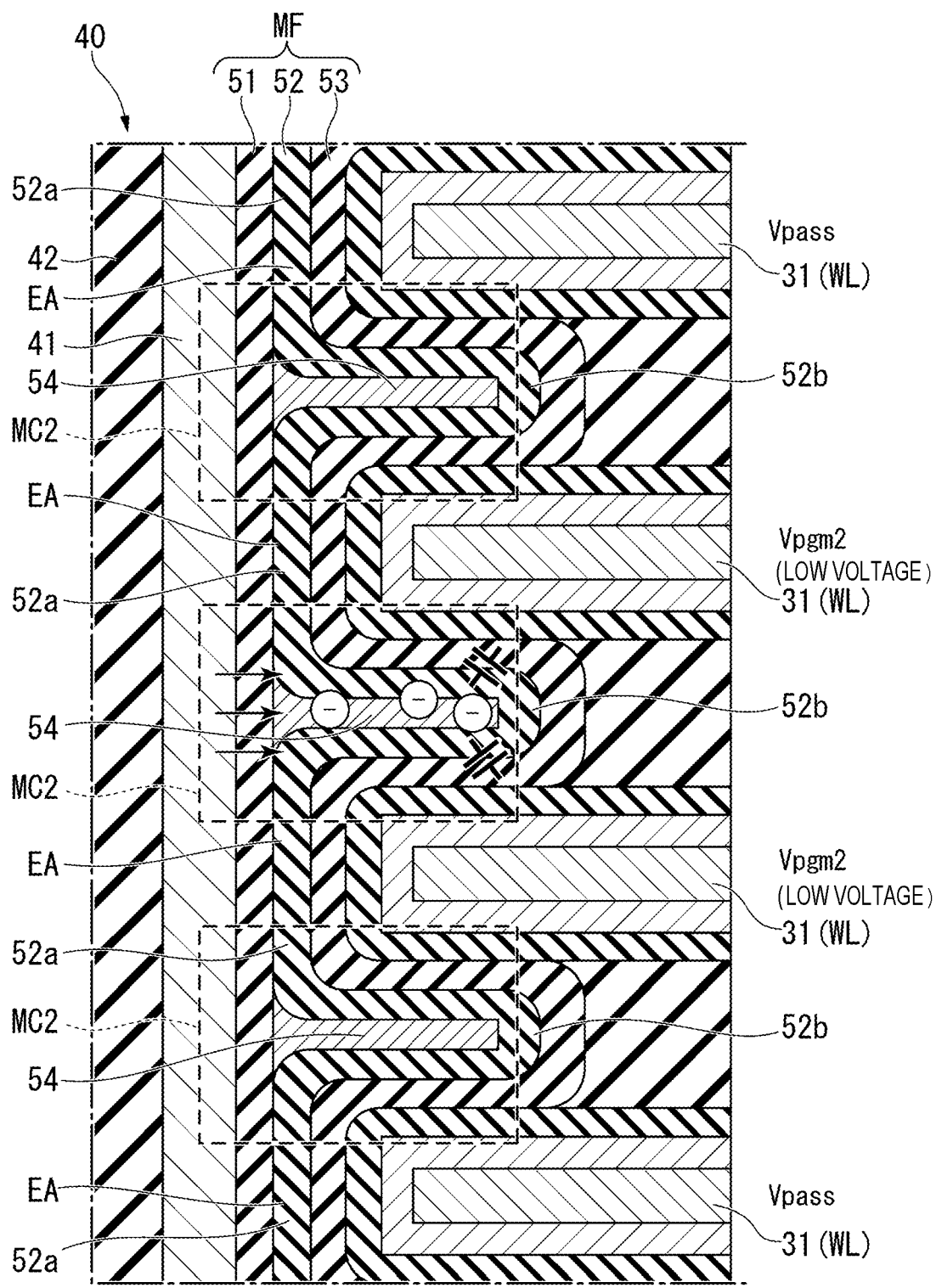
FIG. 8 is a cross-sectional view illustrating a write operation for a second memory cell according to at least one embodiment.

FIG. 8 is a cross-sectional view illustrating a write operation for the second memory cell MC2. In the write operation for the second memory cell MC2, a programming pulse as a second write voltage Vpgm2 is applied to the two word lines WLs (hereinafter, referred to as "selected word lines WLs") located above and below the second memory cell MC2 to be written. In the write operation for the second memory cell MC2, the same voltage is applied to the two word lines WL located above and below the second memory cell MC2. The second write voltage Vpgm2 is lower than, for example, the first write voltage Vpgm1. Meanwhile, a voltage Vpass is applied to the word lines WLs other than the selected word lines WLs (hereinafter, referred to as "non-selected word lines WLs") because the voltage is so high that the memory cell MC adjacent to the non-selected word lines WLs is turned on and the voltage is so low that writing is not performed.

As a result, electrons are sucked up from the channel layer 41 to the floating gate electrode 54 of the second memory cell MC2 to be written, and charges are accumulated in the floating gate electrode 54. The sense amplifier module 17 determines whether the threshold voltage of the second memory cell MC2 to be written reaches a voltage preset according to the data value to be written for each cycle of the programming pulse. Then, according to the determination result by the sense amplifier module 17, the application of the programming pulse is continued until the threshold voltage of the second memory cell MC2 reaches the voltage corresponding to the data value to be written. As a result, writing to the second memory cell MC2 is performed.

<2.5 Characteristics of Memory Cell>

Next, the characteristics of the first memory cell MC1 and the second memory cell MC2 will be described. In at least one embodiment, as an example, the first memory cell MC1 is used as a triple level cell (TLC) capable of storing 3 bits. Meanwhile, the second memory cell MC2 is used as a single level cell (SLC) capable of storing one bit. In this case, the storage capacity may be doubled as compared with the configuration in which the second memory cell MC2 does not exist.

Figure 9B:
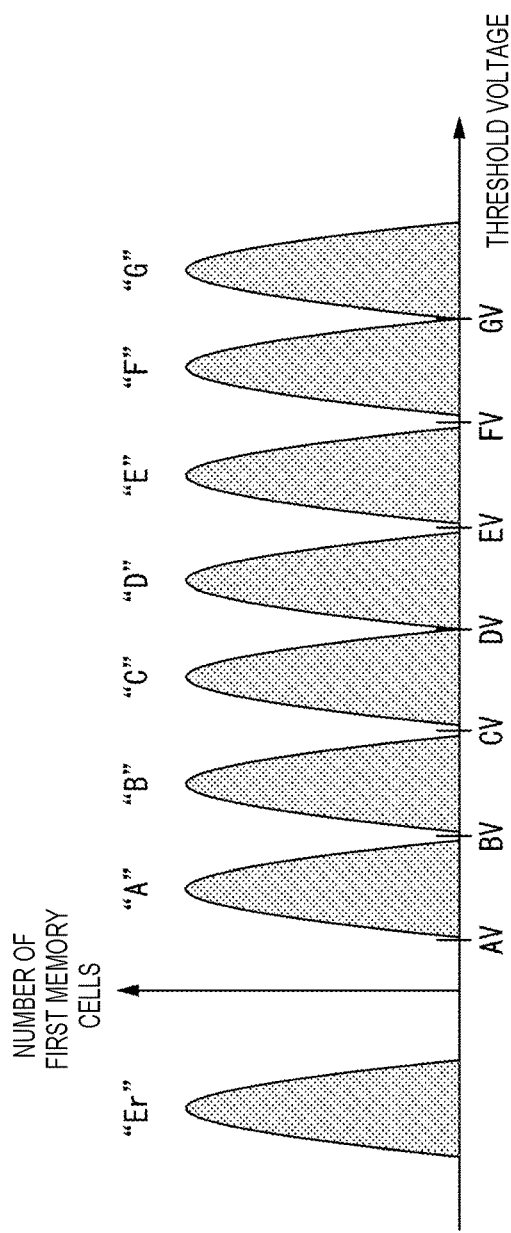
FIGS. 9A and 9B are diagrams illustrating the characteristics of a memory cell according to at least one embodiment.
Figure 9A:
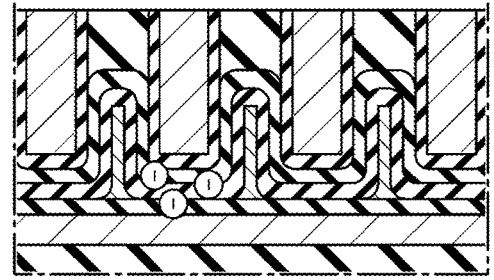

FIGS. 9A and 9B are diagrams illustrating the characteristics of the memory cells MC1 and MC2. FIG. 9A illustrates a state in which writing to the second memory cell MC2 was not performed. FIG. 9B illustrates the writing characteristics for the first memory cell MC1 in the state illustrated in FIG. 9A. Here, even a plurality of first memory cells MC1 that stores the same data value may have different threshold voltages. Therefore, the threshold voltages of the plurality of first memory cells MC1 that store the same data value form one distribution called Lob. When the first memory cell MC1 is used in a triple level cell (TLC), the threshold voltage distribution of the first memory cell MC1 includes eight Lobs. Of the eight Lobs illustrated in FIGS. 9A and 9B, the first memory cell MC1 belonging to the eight Lobs in order from the lowest distribution is in Er state, A state, B state, C state, D state, E state, F state, and G state, respectively. The Er state, A state, B state, C state, D state, E state, F state, and G state are treated as a state of storing, for example, "111" data, "011" data, "001" data, "101" data, "100" data, "000" data, "010" data, and "110" data, respectively. The Er state corresponds to the erase state.

The control circuit 14 uses verify voltages AV, BV, CV, DV, EV, FV, and GV to confirm (verify) the completion of writing of each data value. "Verify" refers to confirmation of whether the writing of the memory cell MC to be written is completed. In the verify, any of the verify voltages AV to GV corresponding to the data value to be written is applied to the word line WL (selected word line WL) corresponding to the memory cell MC to be written. In the present embodiment, when the first memory cell MC1 to be written to any of the A state to the G state has a threshold voltage having a magnitude equal to or higher than the verify voltages AV to GV corresponding to the data value to be written, it is determined that the writing to the first memory cell MC1 is completed.

Figure 10B:
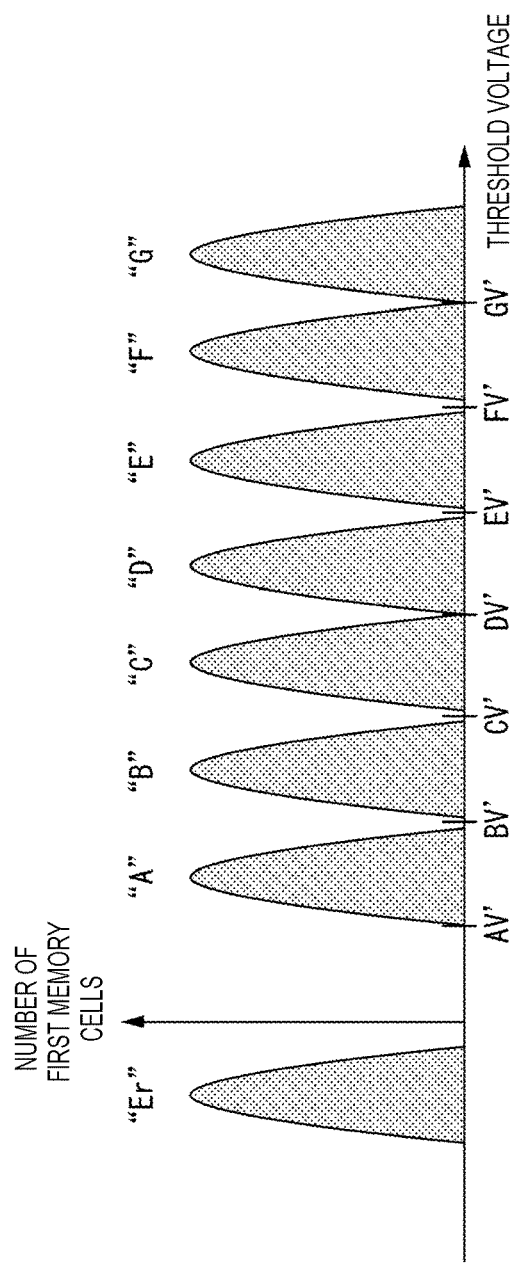
FIGS. 10A and 10B are other diagrams illustrating the characteristics of the memory cell according to the embodiment.
Figure 10A:
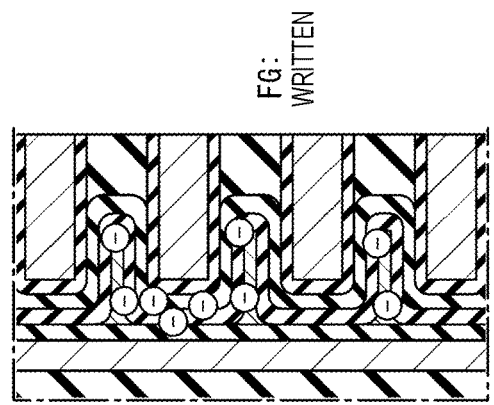

FIGS. 10A and 10B are other diagrams illustrating the characteristics of the memory cells MC1 and MC2. FIG. 10A illustrates a state in which writing to the second memory cell MC2 is performed. FIG. 10B illustrates the writing characteristics for the first memory cell MC1 in the state illustrated in FIG. 10A. As illustrated in FIG. 10B, when the data value is written to the second memory cell MC2, the threshold voltage distribution (i.e., eight Lobs) of the first memory cell MC1 shifts to the high voltage side. Therefore, in the state where writing to the second memory cell MC2 is performed, the control circuit 14 uses the verify voltages AV', BV', CV', DV', EV', FV', and GV' to confirm (verify) the completion of writing of each data value. The verify voltages AV', BV', CV', DV', EV', FV', and GV' are higher than the verify voltages AV, BV, CV, DV, EV, FV, and GV, respectively.

FIGS. 10A and 10B illustrate a state in which writing is performed to both the upper and lower second memory cells MC2 adjacent to the first memory cell MC1 to be written. When only one of the upper and lower second memory cells MC2 adjacent to the first memory cell MC1 to be written is written, the threshold voltage distribution of the first memory cell MC1 (i.e., eight Lobs) may become another threshold voltage distribution. In this case, the control circuit 14 may use yet another verify voltage corresponding to the other threshold voltage distribution.

In the data value read operation, the bit line BL corresponding to the memory cells MC1 and MC2 to be read is pre-charged. Then, plural types of read voltages Vread (threshold determination voltages) for determining the threshold voltages of the memory cells MC1 and MC2 to be read are sequentially applied to the word lines WL corresponding to the memory cells MC1 and MC2 to be read (i.e., one word line WL in the memory cell MC1 and two upper and lower word line WLs in the memory cell MC2). The sense amplifier module 17 detects whether the charges stored in the bit line BL by pre-charging flowed out to the source line SL through the channel layer 41 when any read voltage Vread is applied thereto, thereby determining the data values stored in the memory cells MC1 and MC2 to be read.

<3. Flow of Control>
<3.1 Flow of Write Operation>

Figure 11:
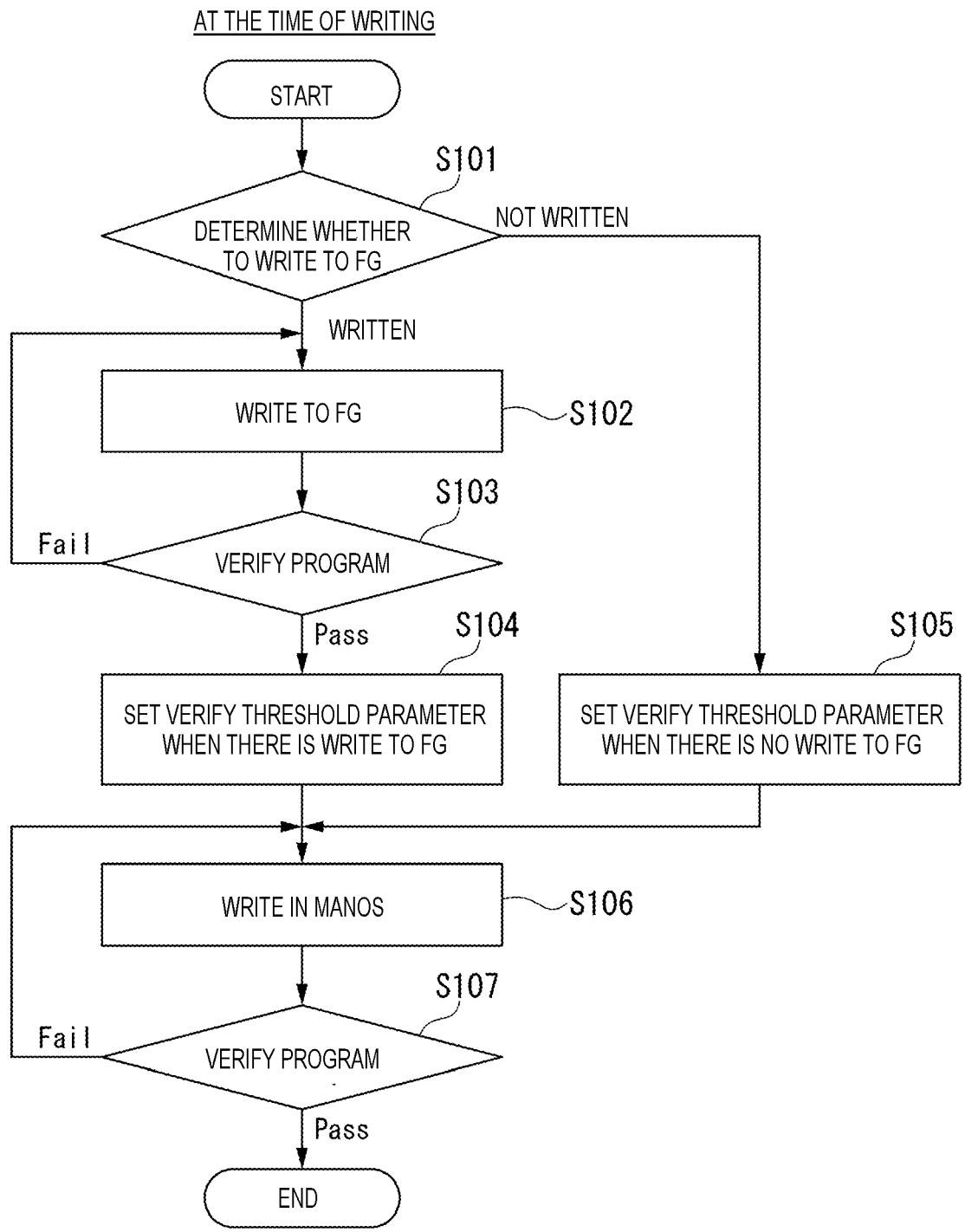
FIG. 11 is a flow chart illustrating a flow of control of a write operation according to at least one embodiment.

FIG. 11 is a flow chart illustrating a flow of control of a write operation for the memory cells MC1 and MC2. In the present embodiment, when there is a data value to be written to the second memory cell MC2 as the writing order, the control circuit 14 first writes to the second memory cell MC2 and then writes to the first memory cell MC1.

As illustrated in FIG. 11, the control circuit 14 first determines whether to write to the second memory cell MC2 based on, for example, data received from a host device (S101). When there is no writing to the second memory cell MC2 (S101: no writing), the control circuit 14 proceeds to the process of S105. Meanwhile, when there is a writing to the second memory cell MC2 (S101: written), the control circuit 14 performs an operation of writing the data value to be written to the second memory cell MC2 (S102). For example, the control circuit 14 applies a programming pulse as a second write voltage Vpgm2 to two selected word lines WL located above and below the second memory cell MC2 to be written. Then, the control circuit 14 determines whether the writing to the second memory cell MC2 is completed by using the verify voltage (S103).

When it is determined that the writing to the second memory cell MC2 is not completed (S103, Fail), the control circuit 14 returns to S102 and repeats the process. Meanwhile, when it is determined that the writing to the second memory cell MC2 is completed (S103: Pass), the control circuit 14 proceeds to the process of S104. For example, when there is a need to write to two or more second memory cells MC2 in a predetermined management unit (e.g., a block BLK unit), the control circuit 14 first executes writing to all the second memory cells MC2.

In at least one embodiment, the control circuit 14 changes the voltage value of the verify voltage (verify threshold value parameter) for confirming the completion of the write of the first memory cell MC1 depending on the presence or absence of the write to the second memory cell MC2. For example, when the second memory cell MC2 adjacent to the first memory cell MC1 to be written is written, the control circuit 14 sets the verify voltages AV' to GV' when the second memory cell is written (S104). Meanwhile, when there is no writing in the second memory cell MC2 adjacent to the first memory cell MC1 to be written, the control circuit 14 sets the verify voltages AV to GV when the second memory cell is not written (S105).

Subsequently, the control circuit 14 performs an operation of writing the data value to be written to the first memory cell MC1 (S107). For example, the control circuit 14 applies a programming pulse as a first write voltage Vpgm1 to the selected word line WL corresponding to the first memory cell MC1 to be written. Then, the control circuit 14 determines whether the writing to the first memory cell MC1 is completed by using the set verify voltage (S108). When it is determined that the writing to the first memory cell MC1 is not completed (S108, Fail), the control circuit 14 returns to S107 and repeats the process. Meanwhile, when it is determined that the writing to the first memory cell MC1 is completed (S108: Pass), the control circuit 14 ends the write operation.

<3.2 Flow of Read Operation>

Figure 12:
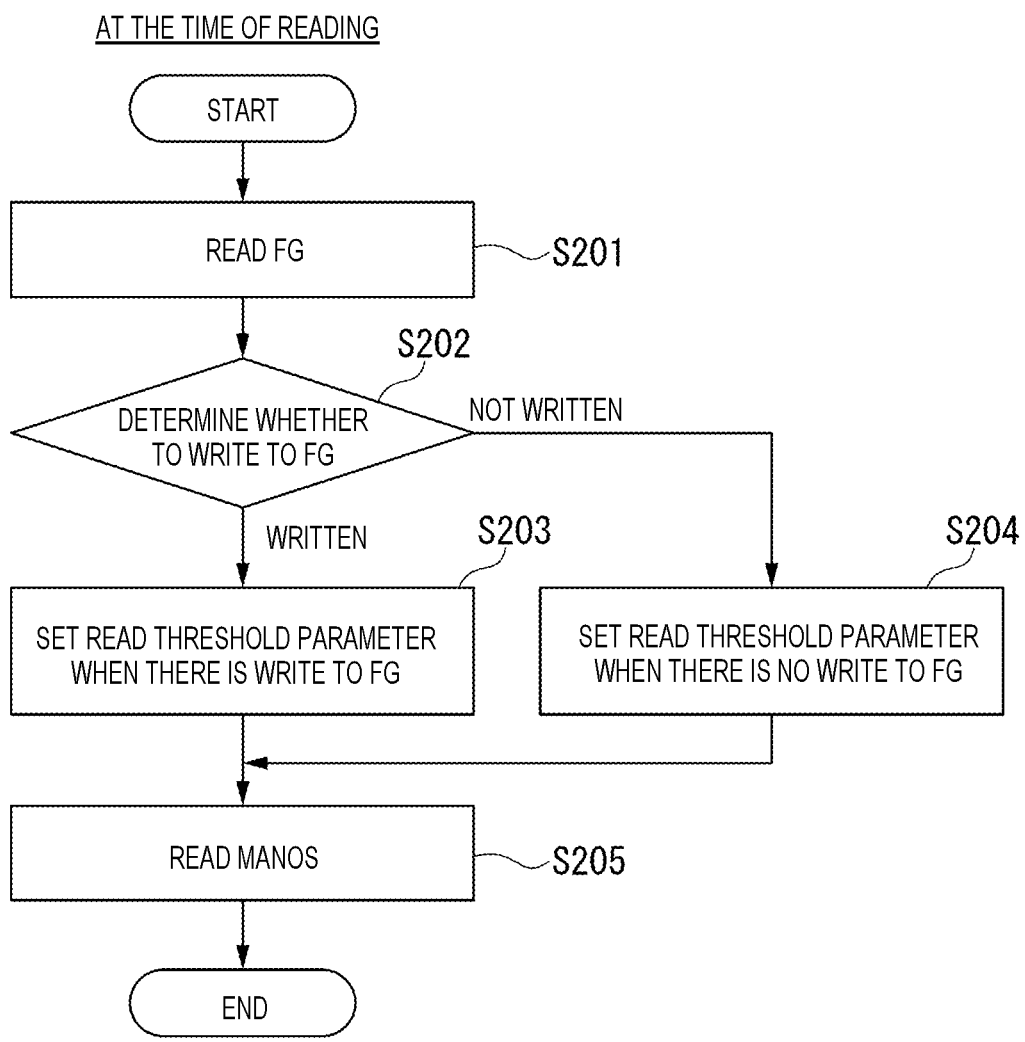
FIG. 12 is a flow chart illustrating a flow of control of a read operation according to at least one embodiment.

FIG. 12 is a flow chart illustrating a flow of control of the read operation for the memory cells MC1 and MC2. In at least one embodiment, the control circuit 14 first reads the second memory cell MC2 and then reads the first memory cell MC1 as the reading order. For example, the control circuit 14 first reads out all the second memory cells MC2 in a predetermined management unit (e.g., a block BLK unit).

As illustrated in FIG. 12, the control circuit 14 first performs a read operation for the second memory cell MC2 (S201). Then, the control circuit 14 determines whether a data value is written in the second memory cell MC2 (S202). When it is determined that there is no writing in the second memory cell MC2 (S202: no writing), the control circuit 14 proceeds to the process of S204. Meanwhile, when it is determined that the second memory cell MC2 is written (S202: written), the control circuit 14 proceeds to the process of S203.

In at least one embodiment, the control circuit 14 changes the voltage value of the read voltage Vread (read threshold value parameter) for executing the read of the first memory cell MC1 depending on the presence or absence of the write to the second memory cell MC2 adjacent to the first memory cell MC1 to be read. For example, when there is a writing to the second memory cell MC2 adjacent to the first memory cell MC1 to be read, the control circuit 14 sets the read voltage Vread when the second memory cell is written (S204). Meanwhile, when there is no writing to the second memory cell MC2 adjacent to the first memory cell MC1 to be read, the control circuit 14 sets the read voltage Vread when there is no writing to the second memory cell (S205). Further, when there is a writing in both the upper and lower second memory cells MC2 adjacent to the first memory cell MC1 to be read and when there is a writing to only one of the upper and lower second memory cell MC2 adjacent to the first memory cell MC1 to be read, the control circuit 14 may use a different read voltage Vread as the read voltage Vread when the second memory cell is written.

Then, the control circuit 14 reads the data value from the first memory cell MC1 by using the read voltage Vread set in the process of S204 or S205 (S206). As a result, the read operation is completed.

<4. Manufacturing Method of Semiconductor Storage Device>

Next, an example of the manufacturing method of the semiconductor storage device 1 will be described.

FIGS. 13A to 15C are cross-sectional views illustrating a method of manufacturing the semiconductor storage device 1. First, as illustrated in FIG. 13A, a semiconductor layer 22, a sacrificial layer 101, and an insulating layer 24 are stacked on a silicon substrate 21. The sacrificial layer 101 is formed of, for example, a silicon nitride. The sacrificial layer 101 is an insulating layer that is replaced with a conductive layer 23 in a subsequent process.

Subsequently, the sacrificial layer 102 and the insulating layer 32 are alternately stacked on the insulating layer 24. The sacrificial layer 102 is formed of, for example, a silicon nitride. The sacrificial layer 102 is an insulating layer that is replaced with a conductive layer 31 in a subsequent process. As a result, an intermediate stack 30A is formed. The sacrificial layer 102 is an example of an "intermediate layer". Instead of providing the sacrificial layer 102, the conductive layer 31 and the insulating layer 32 may be directly and alternately stacked. In this case, the conductive layer 31 corresponds to an example of the "intermediate layer". Next, the insulating layer 39 is stacked on the intermediate stack 30A.

Next, as illustrated in FIG. 13B, a memory hole MH is provided in the intermediate stack 30A. The memory hole MH is an opening extending in the Z direction. The memory hole MH penetrates the insulating layer 39, the intermediate stack 30A, the insulating layer 24, and the sacrificial layer 101 in the Z direction, and is formed halfway through a semiconductor layer 22. The memory hole MH is an example of a "space portion". Next, as illustrated in FIG. 13C, an etching solution is supplied to the inside of the memory hole MH, whereby each end portion of the plurality of insulating layers 32 exposed to the memory hole MH is removed by etching. As a result, an intermediate stack 30B having a plurality of recesses 37 located between two adjacent sacrificial layers 102 among the plurality of sacrificial layers 102 is formed on the inner surface exposed to the memory hole MH.

Next, as illustrated in FIG. 14A, the material of the block insulating film 53 and the material of the charge trap film 52 are sequentially supplied to the inside of the memory hole MH, and the block insulating film 53 and the charge trap film 52 are formed. In at least one embodiment, since a plurality of recesses 37 is provided on the inner surface of the intermediate stack 30B exposed to the memory hole MH, each part of the block insulating film 53 and the charge trap film 52 is formed along the inner surfaces of the plurality of recesses 37. As a result, a second portion 53b of the block insulating film 53 and a second portion 52b of the charge trap film 52 are formed.

Next, as illustrated in FIG. 14B, inside the memory hole MH, an impurity-doped amorphous silicon layer is crystallized and a polysilicon layer is formed along the inner surface of the charge trap film 52. As a result, the inside of the second portion 52b of the charge trap film 52 is filled. Next, for example, unnecessary portions of polysilicon (e.g., portions other than the inside of the second portion 52b of the charge trap film 52) are removed by etching. Thus, a floating gate electrode 54 is formed. Next, as illustrated in FIG. 14C, the material of the tunnel insulating film 51, the material of the channel layer 41, and the material of the core insulating portion 42 are sequentially supplied to the inside of the memory hole MH, and the tunnel insulating film 51, the channel layer 41, and the core insulating portion 42 are formed.

Figure 15A:
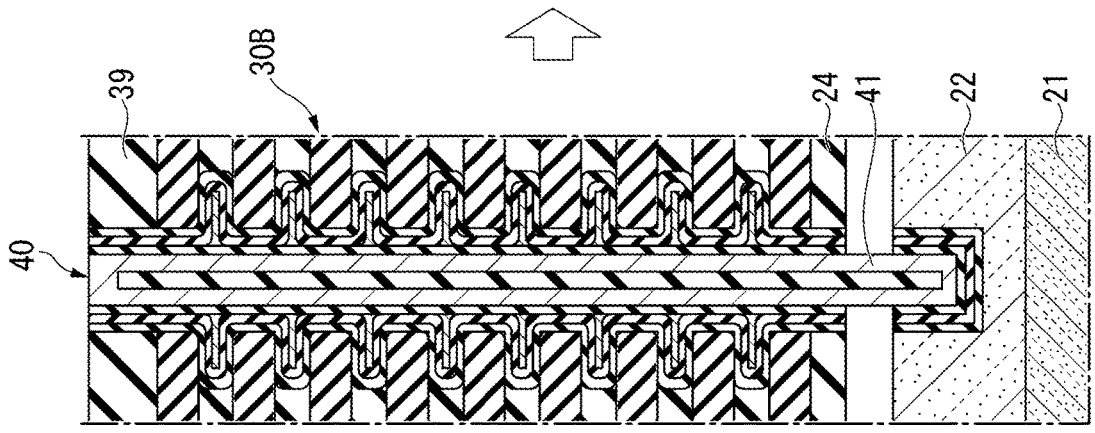
FIGS. 15A to 15C are cross-sectional views illustrating a method of manufacturing the semiconductor storage device according to at least one embodiment.
Figure 15B:
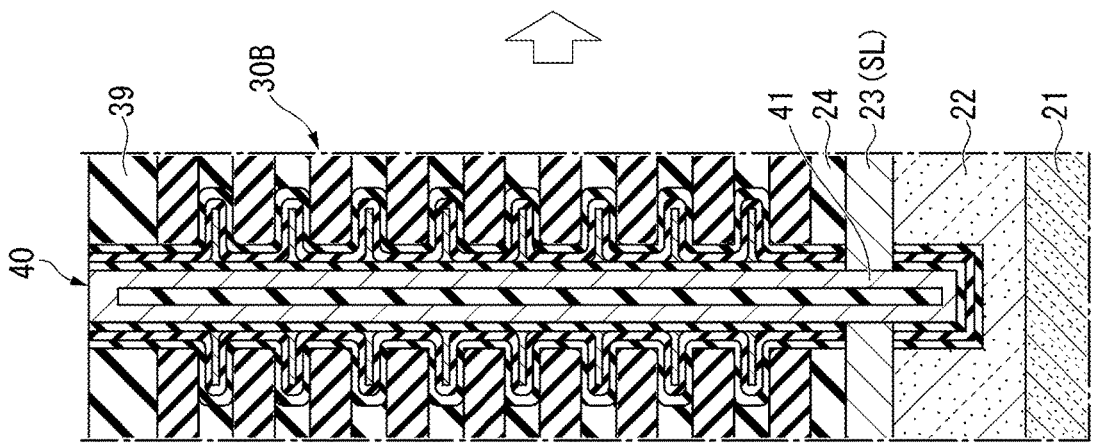

Next, as illustrated in FIG. 15A, an etching solution is supplied through a hole or trench (not illustrated), and a sacrificial layer 101 is removed. At this time, a part of the multilayer film MF located at the same height as the sacrificial layer 101 is removed. Next, as illustrated in FIG. 15B, the conductive material is supplied to the space from which the sacrificial layer 101 was removed, and a conductive layer 23 (source line SL) is formed.

Figure 15C:
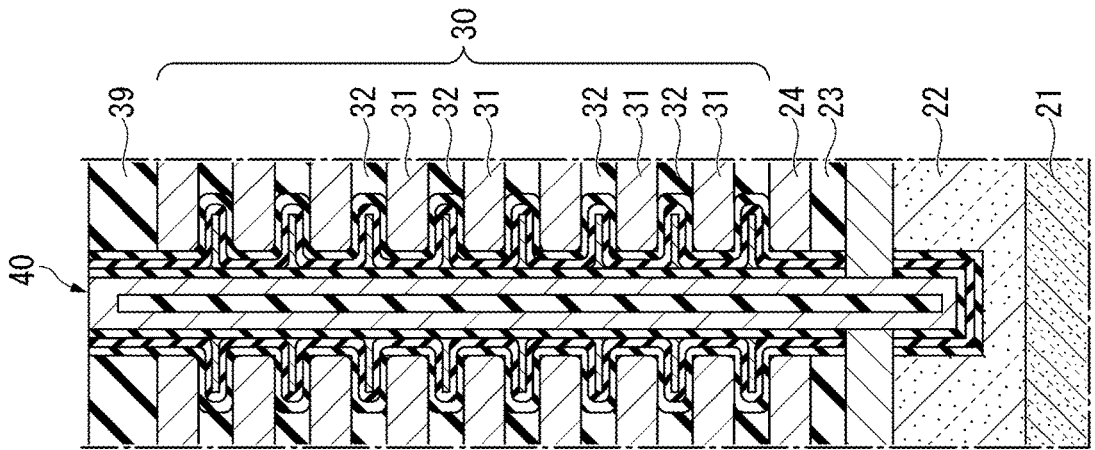

Next, as illustrated in FIG. 15C, an etching solution is supplied through a hole or trench (not illustrated) and the plurality of sacrificial layers 102 contained in an intermediate stack 30B are removed. Then, the material of the conductive layer 31 is supplied to the space from which the plurality of sacrificial layers 102 were removed, and the word line WL, the first select gate line SGL1, and the second select gate line SGL2 are formed. As a result, the stack 30 is formed. Thereafter, a contact 81 and a bit line BL are formed, and the semiconductor storage device 1 is completed.

<5. Advantages>

In a semiconductor storage device in which memory cells are three-dimensionally stacked, it is becoming difficult to further reduce the thickness of the word line and the interlayer insulating film due to one or more reasons such as an increase in the write voltage applied to the word line WL, a withstand voltage between adjacent word lines, and interference between adjacent memory cells. Therefore, it is preferable that the capacity of the semiconductor storage device may be increased from a viewpoint different from the thinning of the word line and the interlayer insulating film.

In at least one embodiment, the semiconductor storage device 1 includes a first charge storage portion (charge storage portion EA) provided between the channel layer 41 and each of the plurality of word lines WLs, and a second charge storage portion (floating gate electrode 54) including a portion interposed between two adjacent word lines WLs in the plurality of word lines WLs in the Z direction.

According to such a configuration, not only the charges may be accumulated in the charge storage portion located between the channel layer 41 and the word line WL, but also a region located between the two word lines WLs in the Z direction may be used as another charge storage portion. As a result, it is possible to implement a further increase in capacity per unit area from a viewpoint different from the thinning of the word line and the interlayer insulating film.

In at least one embodiment, the first charge storage portion is a part of the charge trap film 52. Meanwhile, the second charge storage portion is the floating gate electrode 54. According to such a configuration, a charge storage portion capable of accumulating a sufficient charge may be provided even in a region located between the two word lines WLs and away from the channel layer 41. According to such a configuration, the writing characteristics to the second memory cell MC2 are good, and the operability and reliability of the semiconductor storage device 1 may be improved.

In at least one embodiment, the charge trap film 52 includes a first portion 52a that includes the charge storage portion EA, and a second portion 52b that swells from the first portion 52a to be separated from the channel layer 41 and is located between the two word lines WL in the Z direction. The floating gate electrode 54 is located in the R direction between the channel layer 41 and at least a part of the second portion 52b of the charge trap film 52. According to such a configuration, the step of dividing the charge trap film 52 may be omitted, and the manufacturability of the semiconductor storage device 1 may be improved. Further, since the second portion 52b of the charge trap film 52 may accumulate charges in an auxiliary manner, it may be possible to further improve the writing characteristics to the second memory cell MC2.

In at least one embodiment, the dimension L of the floating gate electrode 54 in the R direction is larger than the dimension T of the floating gate electrode 54 in the Z direction. According to such a configuration, the capacitance between the floating gate electrode 54 and the word line WL may be increased. As a result, the writing characteristics to the second memory cell MC2 may be further improved.

In at least one embodiment, when accumulating charges in the first charge storage portion (charge storage portion EA), the control circuit 14 applies a first write voltage on one word line WL closest to the first charge storage portion among the plurality of word lines WLs, and when accumulating charges in the second charge storage portion (floating gate electrode 54), the control circuit 14 applies a second write voltage to two word lines WLs located above and below the second charge storage portion. According to such a configuration, a sufficient voltage may be applied to the second charge storage portion as well. As a result, the writing characteristics to the second memory cell MC2 may be further improved.

In at least one embodiment, when accumulating charges in the first charge storage portion (charge storage portion EA) and the second charge storage portion (floating gate electrode 54), the control circuit 14 first performs a write operation for accumulating charges in the second charge storage portion, and then performs a write operation for accumulating charges in the first charge storage portion. According to such a configuration, it is possible to reduce the disruption of the charge trap type charge storage portion, which is more likely to cause data retention than the floating gate type charge storage portion. As a result, the reliability of the semiconductor storage device 1 may be further improved.

(Modification)

Next, a modification will be described. This modification is different from the above-described embodiment in that the multilayer film MF is divided into two in the Y direction in each columnar body 40A. The configuration other than that described below is the same as that of the above embodiment. In this modification, the first side in the Y direction may be referred to as a "+Y direction", and the side opposite to the first side in the Y direction may be referred to as a "−Y direction".

Figure 16:
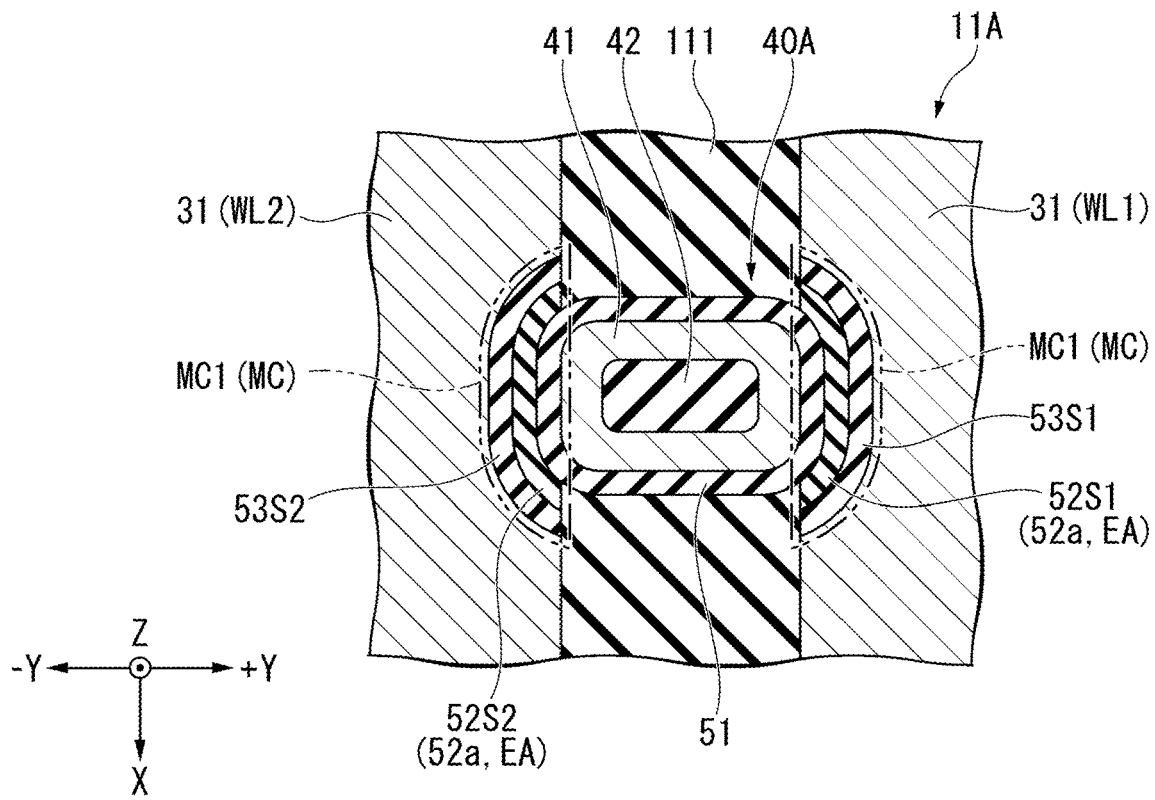
FIG. 16 is a cross-sectional view illustrating a part of a memory cell array according to a modification of at least one embodiment.

FIG. 16 is a cross-sectional view illustrating a part of the memory cell array 11A of the modification, and is a cross-sectional view corresponding to FIG. 5 of the above-described embodiment. In this modification, the memory cell array 11A has an insulator 111. The insulator 111 penetrates the stack 30 in the Z direction and extends in the X direction. The word line WL is divided by the insulator 111 into a first word line WL1 located on the +Y direction side with respect to the insulator 111 and a second word line WL2 located on the −Y direction side with respect to the insulator 111.

The charge trap film 52 is formed by the insulator 111 into a first side portion 52S1 located on the +Y direction side with respect to the insulator 111 and a second side portion 52S2 located on the −Y direction side with respect to the insulator 111. Similarly, the block insulating film 53 is divided into a first side portion 53S1 located on the +Y direction side with respect to the insulator 111 and a second side portion 53S2 located on the −Y direction side with respect to the insulator 111. As a result, the first memory cell MC1, which is MANOS, is formed on each of the +Y direction side and the −Y direction side of the insulator 111.

Figure 17:
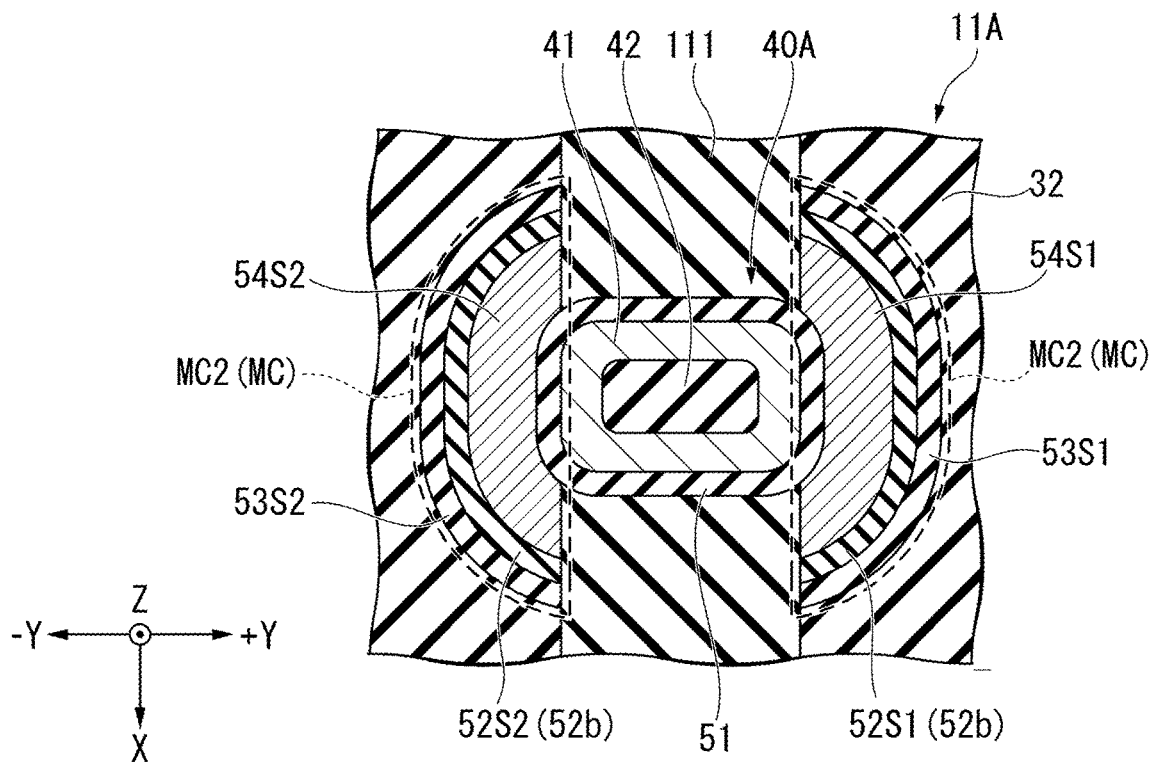
FIG. 17 is a cross-sectional view illustrating a part of a memory cell array according to a modification of at least one embodiment.

FIG. 17 is a cross-sectional view illustrating a part of a memory cell array 11A of the modification, and is a cross-sectional view corresponding to FIG. 6 of the above-described embodiment. The floating gate electrode 54 is divided by the insulator 111 into a first side electrode 54S1 located on the +Y direction side with respect to the insulator 111 and a second side electrode 54S2 located on the −Y direction side with respect to the insulator 111. As a result, the second memory cell MC2, which is an FG, is formed on each of the +Y direction side and the −Y direction side of the insulator 111. According to such a configuration, the capacity may be further increased.

The embodiment and modification have been described above. However, the embodiment and modification are not limited to the above-mentioned examples. For example, the charge trap film 52 may be divided into a plurality of parts in the Z direction so that the charge trap film 52 exists only at the same height as the word line WL. In other words, the charge trap film 52 does not need to have the second portion 52b. The above-described embodiment is an example in which the first memory cell MC1 is used as a triple level cell (TLC) and the second memory cell MC2 is used as a single level cell (SLC). Alternatively, each of the first memory cell MC1 and the second memory cell MC2 may be a single level cell (SLC), a multi-level cell (MLC), a triple level cell (TLC), or a quad level cell (QLC).

According to at least one embodiment described above, the semiconductor storage device includes a first charge storage portion provided between the channel layer and each of the plurality of conductive layers, and a second charge storage portion including a portion interposed between two adjacent conductive layers in the plurality of conductive layers. According to such a configuration, it is possible to provide a semiconductor storage device suitable for increasing the capacity.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
    a stack including a plurality of conductive layers and a plurality of insulating layers, the plurality of conductive layers and the plurality of insulating layers being alternately stacked one by one in a first direction;
    a channel layer extending in the first direction in the stack;
    a first charge storage portion disposed between the channel layer and each of the plurality of conductive layers, in a second direction intersecting with the first direction; and
    a second charge storage portion including a portion, the portion interposed between two adjacent conductive layers in the plurality of conductive layers in the first direction.

2. The semiconductor storage device according to claim 1, wherein the first charge storage portion contains a first material, and
    the second charge storage portion contains a second material different from the first material.

3. The semiconductor storage device according to claim 2, wherein the first material is a silicon nitride, and the second material is polysilicon containing impurities.

4. The semiconductor storage device according to claim 1, wherein the first charge storage portion is at least a part of a charge trap film, and the second charge storage portion is a floating gate electrode.

5. The semiconductor storage device according to claim 1, wherein the first charge storage portion and the second charge storage portion are alternately arranged in the first direction.

6. The semiconductor storage device according to claim 1, further comprising: a charge trap film disposed between the channel layer and the plurality of conductive layers,
    wherein the charge trap film includes:
        a first portion that is located between the channel layer and each of the plurality of conductive layers in the second direction, and the first portion includes the first charge storage portion, and
        a second portion that bulges from the first portion in a direction away from the channel layer and is located between the two conductive layers in the first direction, and
        the second charge storage portion is located between the channel layer and at least a part of the second portion of the charge trap film in the second direction.

7. The semiconductor storage device according to claim 6, further comprising:
    an insulating layer located between the channel layer and the charge trap film, wherein the insulating layer extends in the first direction,
    wherein the second charge storage portion is located between the insulating layer and at least a part of the second portion of the charge trap film in the second direction.

8. The semiconductor storage device according to claim 1, wherein a dimension of the second charge storage portion in the second direction is larger than a dimension of the second charge storage portion in the first direction.

9. The semiconductor storage device according to claim 1, further comprising: a circuit which, when accumulating charges in the first charge storage portion, is configured to apply a first write voltage to one conductive layer closest to the first charge storage portion among the plurality of conductive layers, wherein when accumulating charges in the second charge storage portion, the circuit is configured to apply a second write voltage to two conductive layers among the plurality of conductive layers.

10. The semiconductor storage device according to claim 9, wherein the second write voltage is lower than the first write voltage.

11. The semiconductor storage device according to claim 9, wherein when accumulating charges in the first charge storage portion and the second charge storage portion, the circuit is configured to first perform a write operation of accumulating charges in the second charge storage portion and then to perform a write operation of accumulating charges in the first charge storage portion.

12. The semiconductor storage device according to claim 1, further comprising a semiconductor substrate, wherein the stack is disposed over the semiconductor substrate.

13. The semiconductor storage device according to claim 1, wherein the channel layer is formed in an annular shape.

14. The semiconductor storage device according to claim 13, further comprising a core insulating portion inside the channel layer.

15. The semiconductor storage device according to claim 1, wherein the channel layer includes a semiconductor material.

16. The semiconductor storage device according to claim 1, wherein at least one of the conductive layers functions as a select gate line.

17. The semiconductor storage device according to claim 1, further comprises a multi-layer film disposed on an outer periphery of the channel layer.

18. The semiconductor storage device according to claim 6, wherein the charge trap film includes silicon nitride.

* * * * *